US012067083B2

United States Patent
Wolke et al.

(10) Patent No.: US 12,067,083 B2
(45) Date of Patent: Aug. 20, 2024

(54) DETECTING DISPLACEMENTS AND/OR DEFECTS IN A POINT CLOUD USING CLUSTER-BASED CLOUD-TO-CLOUD COMPARISON

(71) Applicant: FARO Technologies, Inc., Lake Mary, FL (US)

(72) Inventors: Matthias Wolke, Korntal-Münchingen (DE); Prashanth Reddy Patlolla, Stuttgart (DE)

(73) Assignee: FARO Technologies, Inc., Lake Mary, FL (US)

(*) Notice: Subject to any disclaimer, the term of this patent is extended or adjusted under 35 U.S.C. 154(b) by 545 days.

(21) Appl. No.: 17/338,890

(22) Filed: Jun. 4, 2021

(65) Prior Publication Data
US 2022/0092345 A1     Mar. 24, 2022

Related U.S. Application Data

(60) Provisional application No. 63/082,206, filed on Sep. 23, 2020.

(51) Int. Cl.
*G06T 19/20*     (2011.01)
*G06F 18/21*     (2023.01)
*G06F 18/23*     (2023.01)
*G06F 30/23*     (2020.01)
*G06T 17/20*     (2006.01)
(Continued)

(52) U.S. Cl.
CPC ........ *G06F 18/23* (2023.01); *G06F 18/2163* (2023.01); *G06F 30/23* (2020.01); *G06T 17/20* (2013.01); *G06T 19/20* (2013.01); *G06V 10/757* (2022.01); *G06V 10/762* (2022.01); *G06T 2219/2004* (2013.01)

(58) Field of Classification Search
CPC ..... G06T 2219/2004; G06T 7/30–7/38; G06T 19/20; G06T 7/10–7/194; G06T 2207/20112–2207/20168; G06T 5/002; G06T 7/50–7/596; G06T 2200/04; G06T 2207/10028; G06T 7/0002–7/001; G06T 2207/30108–2207/30164; G06V 10/24–10/248; G06V 10/26–10/273; G06V 10/762–10/7635; G06V 20/64–20/653; G06F 18/23–18/2337; G01N 21/88–21/958
See application file for complete search history.

(56) References Cited

U.S. PATENT DOCUMENTS 5,173,796 A * 12/1992 Palm ................ G02B 26/101
                                                              348/46
9,599,455 B2   3/2017 Heidemann et al.

OTHER PUBLICATIONS

Park Hong-Seok et al, "Development of an Inspection System for Defect Detection in Pressed Parts using Laser Scanned Data" copyright 2014, Published by Elsevier Ltd, pp. 931-936. (Year: 2014).*

(Continued)

*Primary Examiner* — Brian Werner
(74) *Attorney, Agent, or Firm* — McCarter & English, LLP; Dave S. Christensen

(57) ABSTRACT

Examples described herein provide a method that includes performing cluster matching with one or more cluster sizes for each of a plurality of points of a measurement point cloud. The method further includes determining, based on results of the multi-radii cluster matching, whether an object is displaced or whether the object includes a defect.

13 Claims, 25 Drawing Sheets

(51) Int. Cl.
*G06V 10/75* (2022.01)
*G06V 10/762* (2022.01)

(56) References Cited

OTHER PUBLICATIONS

Min Lu et al., "Recognizing Objects in 3D Point Clouds with Multi-Scale Local Features", Sensors 2014, ISSN 1424-8220, copyright 2014, pp. 24156-24173. (Year: 2014).*
Daricilar et al.; "Measurement Error of Visual Casting Surface Inspection"; Proceeding of the 2005 Steel Founders' Society of America—Technical and Operating Conference; 2005; 11 Pages.
European Search Report Issued in European Application No. 21197421.7-1210 dated Feb. 15, 2022; 8 Pages.
Rashid et al.; "Multi-Robot Localization and Orientation Estimation Using Robotic Cluster Matching Algorithm"; Robotics and Autonomous Systems; vol. 63; 2015; pp. 108-121.
Besl et al.; "A Method for Registration of 3-D Shapes"; IEEE Transactions on Pattern Analysis and Machine Intelligence; vol. 14, No. 2; Feb. 1992; pp. 239-256.
Lague et al.; "Accurate 3D Comparison of Complex Topography with Terrestrial Laser Scanner: Application to the Rangitikei Canyon [N-Z]"; ISPRS Journal of Photogrammetry and Remote Sensing; vol. 82; Feb. 13, 2013; 28 Pages.
Rabbani et al.; "Segmentation of Point Clouds Using Smoothness Constraint"; ISPRS Commission V Symposium Image Engineering and Vision Metrology; vol. 36, Part 5; Dresden 25-27; Sep. 2006; pp. 248-253.

\* cited by examiner

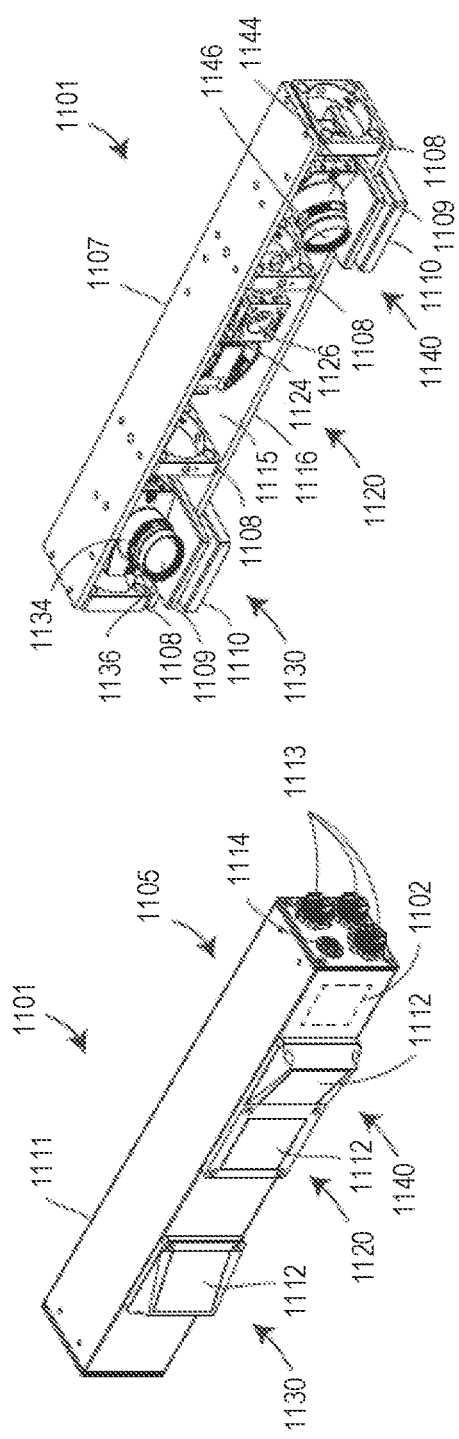
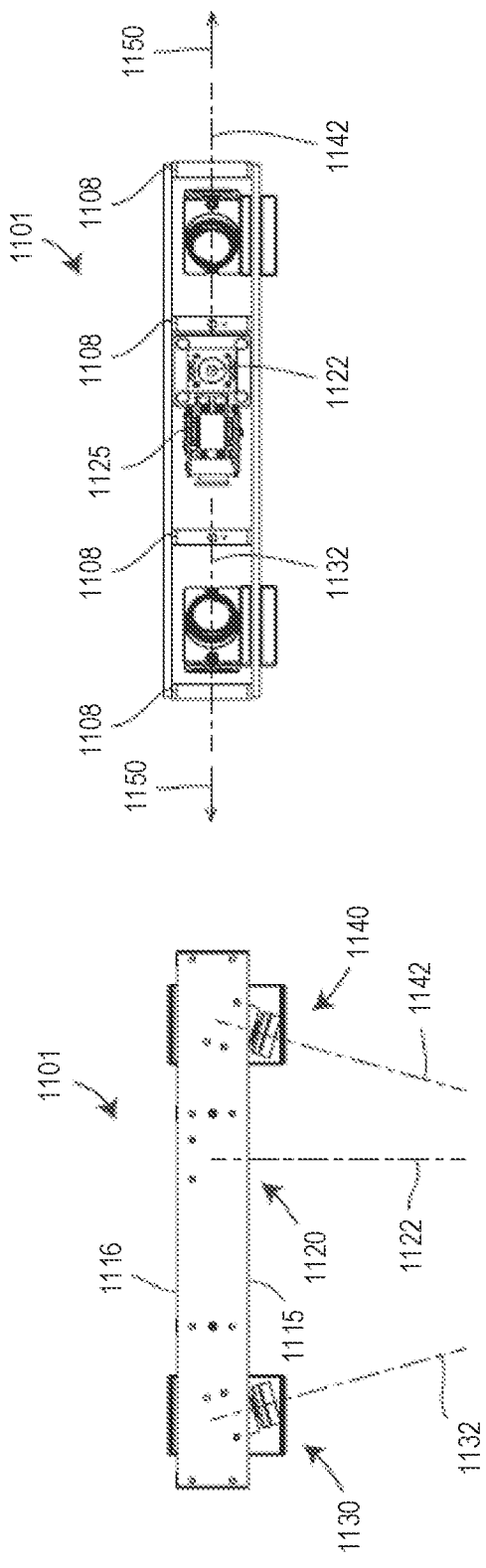

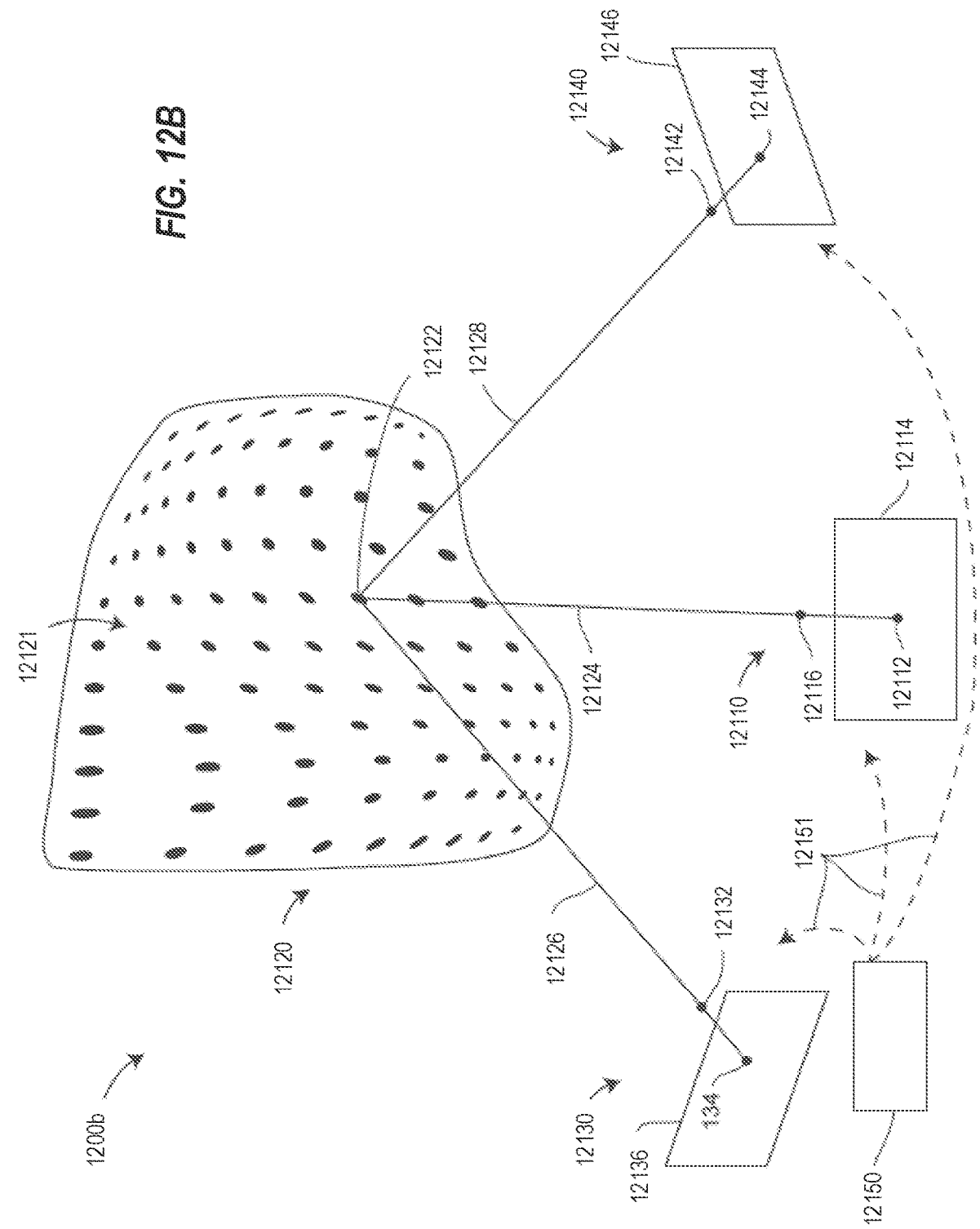

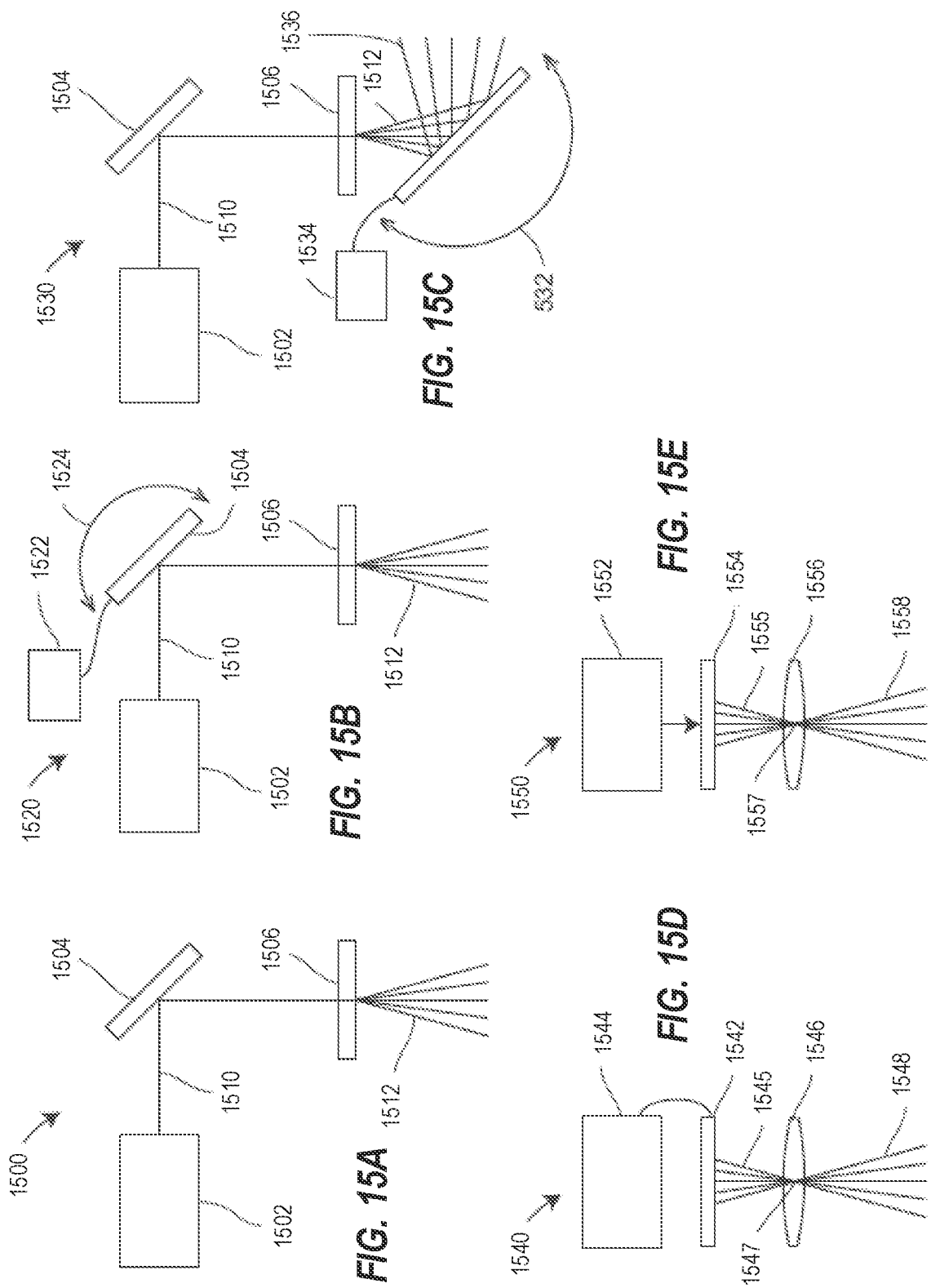

DETECTING DISPLACEMENTS AND/OR DEFECTS IN A POINT CLOUD USING CLUSTER-BASED CLOUD-TO-CLOUD COMPARISON

CROSS REFERENCE TO RELATED APPLICATIONS

This application claims the benefit of U.S. Provisional Application Ser. No. 63/082,206, filed Sep. 23, 2020, the entire disclosure of which is incorporated herein by reference.

BACKGROUND

Embodiments of the present disclosure generally relate to detecting displacements and/or defects in a point cloud and, in particular, to techniques for detecting displacements and/or defects in a point cloud using cluster-based cloud-to-cloud comparison.

The acquisition of three-dimensional coordinates of an object or an environment is known. Various techniques may be used, such as time-of-flight (TOF) or triangulation methods, for example. A TOF system such as a laser tracker, for example, directs a beam of light such as a laser beam toward a retroreflector target positioned over a spot to be measured. An absolute distance meter (ADM) is used to determine the distance from the distance meter to the retroreflector based on the length of time it takes the light to travel to the spot and return. By moving the retroreflector target over the surface of the object, the coordinates of the object surface may be ascertained. Another example of a TOF system is a laser scanner that measures a distance to a spot on a diffuse surface with an ADM that measures the time for the light to travel to the spot and return. TOF systems have advantages in being accurate, but in some cases may be slower than systems that project a pattern such as a plurality of light spots simultaneously onto the surface at each instant in time.

In contrast, a triangulation system, such as a scanner, projects either a line of light (e.g., from a laser line probe) or a pattern of light (e.g., from a structured light) onto the surface. In this system, a camera is coupled to a projector in a fixed mechanical relationship. The light/pattern emitted from the projector is reflected off of the surface and detected by the camera. Since the camera and projector are arranged in a fixed relationship, the distance to the object may be determined from captured images using trigonometric principles. Triangulation systems provide advantages in quickly acquiring coordinate data over large areas.

In some systems, during the scanning process, the scanner acquires, at different times, a series of images of the patterns of light formed on the object surface. These multiple images are then registered relative to each other so that the position and orientation of each image relative to the other images are known. Where the scanner is handheld, various techniques have been used to register the images. One common technique uses features in the images to match overlapping areas of adjacent image frames. This technique works well when the object being measured has many features relative to the field of view of the scanner. However, if the object contains a relatively large flat or curved surface, the images may not properly register relative to each other.

Accordingly, while existing 3D scanners are suitable for their intended purposes, what is needed is a 3D scanner having certain features of embodiments of the present invention.

SUMMARY

According to one or more examples, a method includes performing cluster matching with one or more cluster sizes for each of a plurality of points of a measurement point cloud. The method further includes determining, based on results of the multi-radii cluster matching, whether an object is displaced or whether the object includes a defect.

In addition to one or more of the features described herein, or as an alternative, further embodiments of the method may include acquiring, using a three-dimensional scanner, the measurement point cloud.

In addition to one or more of the features described herein, or as an alternative, further embodiments of the method may include performing segmentation to generate larger clusters of connected regions using region growing segmentation on extracted displaced points.

In addition to one or more of the features described herein, or as an alternative, further embodiments of the method may include performing false-positive detection to remove one or more false-positive segments.

In addition to one or more of the features described herein, or as an alternative, further embodiments of the method may include that the false-positive detection is performed based at least in part on a deviation histogram of the points in this cluster.

In addition to one or more of the features described herein, or as an alternative, further embodiments of the method may include performing a comparison between the measurement point cloud and reference data to determine a displacement value between each point in the measurement point cloud and corresponding point in the reference data.

In addition to one or more of the features described herein, or as an alternative, further embodiments of the method may include that the reference data is a reference point cloud.

In addition to one or more of the features described herein, or as an alternative, further embodiments of the method may include that the reference data is a computer-aided design model.

In addition to one or more of the features described herein, or as an alternative, further embodiments of the method may include that the reference data is scan data of a scanned golden part.

In addition to one or more of the features described herein, or as an alternative, further embodiments of the method may include that a set of points selected for a cluster is based at least in part on a result of a point-wise distance analysis between the measurement point cloud and the reference data.

In addition to one or more of the features described herein, or as an alternative, further embodiments of the method may include that performing the comparison comprises performing a multi-scale model-to-model cloud comparison.

In addition to one or more of the features described herein, or as an alternative, further embodiments of the method may include that performing the cluster matching comprises performing a multi-radii cluster matching.

In addition to one or more of the features described herein, or as an alternative, further embodiments of the method may include that performing the multi-radii cluster matching comprises determining a first cluster defined by a first radius R1.

In addition to one or more of the features described herein, or as an alternative, further embodiments of the method may include that performing the multi-radii cluster matching comprises determining a second cluster defined by a second radius R2, wherein the second radius R2 is greater than the first radius R1.

In addition to one or more of the features described herein, or as an alternative, further embodiments of the method may include that determining, based on results of the multi-radii cluster matching, whether the object is displaced is based on one or more of a mean value, a median value, a standard deviation, or a median of an absolute distance.

In addition to one or more of the features described herein, or as an alternative, further embodiments of the method may include that performing the multi-radii cluster matching comprises applying an iterative closest point technique to match points in a test cluster with points in a reference cluster.

In addition to one or more of the features described herein, or as an alternative, further embodiments of the method may include that performing the multi-radii cluster matching comprises generating a transformation matrix.

In addition to one or more of the features described herein, or as an alternative, further embodiments of the method may include that the transformation matrix is used to calculate a new displacement value.

In addition to one or more of the features described herein, or as an alternative, further embodiments of the method may include that a distance of a center of mass of the cluster of the reference point cloud and a center of mass of the cluster of the measured point cloud is used to calculate the new displacement vector.

In addition to one or more of the features described herein, or as an alternative, further embodiments of the method may include that performing the multi-radii cluster matching comprises determining a first cluster defined by a first radius R1, determining a second cluster defined by a second radius R2, determining a third cluster defined by a third radius R3, and determining a fourth cluster defined by a fourth radius R4, wherein the fourth radius R4 is greater than the third radius R3, which is greater than the second radius R2, which is greater than the first radius R1.

In addition to one or more of the features described herein, or as an alternative, further embodiments of the method may include responsive to determining that the object is displaced, performing validation based at least in part on a displacement of at least one different cluster at a location of interest, where the other clusters incorporate points which are part of a first cluster.

In addition to one or more of the features described herein, or as an alternative, further embodiments of the method may include performing point cloud alignment between the measurement point cloud and reference data.

According to one or more examples, a method includes acquiring a measured point cloud of an object using a three-dimensional scanner to scan the object. The method further includes performing a point cloud alignment between the measured point cloud and a reference point cloud. The method further includes performing a multi-scale model-to-model cloud comparison between the measurement point cloud and the reference point. The method further includes performing displaced points filtering. The method further includes performing multi-radii cluster matching. The method further includes performing extraction of displaced points. The method further includes performing segmentation. The method further includes performing segment matching. The method further includes performing segments filtering. The method further includes determining whether the object is displaced.

BRIEF DESCRIPTION OF THE DRAWINGS

The subject matter, which is regarded as the invention, is particularly pointed out and distinctly claimed in the claims at the conclusion of the specification. The foregoing and other features, and advantages of embodiments of the invention are apparent from the following detailed description taken in conjunction with the accompanying drawings in which:

FIG. 7 depicts a point cloud of extracted displaced points according to one or more embodiments described herein;

FIGS. 11A, 11B, 11C, 11D, 11E are isometric, partial isometric, partial top, partial front, and second partial top views, respectively, of a triangulation scanner according to one or more embodiments described herein;

FIG. 12B is a schematic representation of a triangulation scanner having a projector that projects and uncoded pattern of uncoded spots, received by a first camera, and a second camera according to one or more embodiments described herein;

FIGS. 15A, 15B, 15C, 15D, 15E are schematic diagrams illustrating different types of projectors according to one or more embodiments described herein;

DETAILED DESCRIPTION

The technical solutions described herein generally relate to detecting displacements in a point cloud using cluster-based cloud-to-cloud comparison. Point clouds can be captured by a three-dimensional (3D) scanning device or "scanner" as depicted in FIG. 1.

Figure 1:
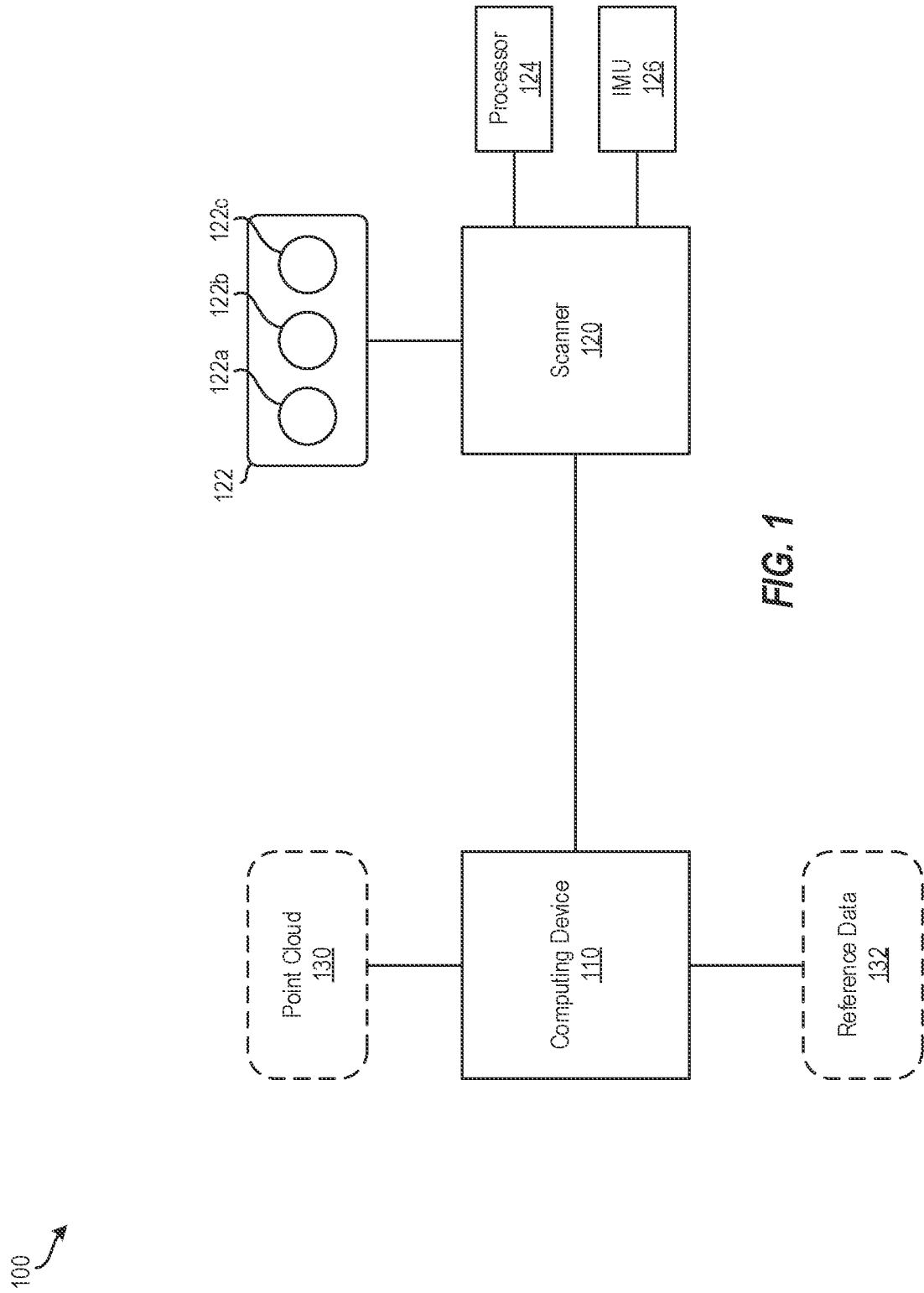
FIG. 1 depicts a system for scanning an environment according to one or more embodiments described herein.

In particular, FIG. 1 depicts a system 100 for scanning an environment according to one or more embodiments described herein. The system 100 includes a computing device 110 coupled with a scanner 120, which can be a 3D scanner or another suitable scanner. The coupling facilitates wired and/or wireless communication between the computing device 110 and the scanner 120. The scanner 120 includes a set of sensors 122. The set of sensors 122 can include different types of sensors, such as LIDAR 122A (light detection and ranging), RGB-D camera 122B (red-green-blue-depth), and wide-angle/fisheye camera 122C, and other types of sensors. The scanner 120 can also include an inertial measurement unit (IMU) 126 to keep track of a 3D movement and orientation of the scanner 120. The scanner 120 can further include a processor 124 that, in turn, includes one or more processing units. The processor 124 controls the measurements performed using the set of sensors 122. In one or more examples, the measurements are performed based on one or more instructions received from the computing device 110. In an embodiment, the LIDAR sensor 122A is a two-dimensional (2D) scanner that sweeps a line of light in a plane (e.g. a plane horizontal to the floor).

According to one or more embodiments described herein, the scanner 120 is a dynamic machine vision sensor (DMVS) scanner manufactured by FARO® Technologies, Inc. of Lake Mary, Florida, USA. DMVS scanners are discussed further with reference to FIGS. 11A-18. In an embodiment, the scanner 120 may be that described in commonly owned United States Patent Publication 2018/0321383 entitled Triangulation Scanner having Flat Geometry and Projecting Uncoded Spots, the contents of which are incorporated by reference herein. It should be appreciated that the techniques described herein are not limited to use with DMVS scanners and that other types of 3D scanners can be used.

The computing device 110 can be a desktop computer, a laptop computer, a tablet computer, a phone, or any other type of computing device that can communicate with the scanner 120.

In one or more embodiments, the computing device 110 generates a point cloud 130 (e.g., a 3D point cloud) of the environment being scanned by the scanner 120 using the set of sensors 122. The point cloud 130 is a set of data points (i.e., a collection of three-dimensional coordinates) that correspond to surfaces of objects in the environment being scanned and/or of the environment itself. According to one or more embodiments described herein, a display (not shown) displays a live view of the point cloud 130.

As noted earlier, the scanner 120, along with capturing the point cloud 130, is also locating itself within the environment. In an embodiment, the scanner 120 uses odometry, which includes using data from motion or visual sensors to estimate the change in position of the scanner 120 over time. Odometry is used to estimate the position of the scanner 120 relative to a starting location. This method is sensitive to errors due to the integration of velocity measurements over time to give position estimates, which generally applies to odometry from inertial measurements. In other embodiments, the scanner 120 estimates its position based only on visual sensors.

A common task in 3D point cloud analysis is a comparison of 3D measurement data (e.g., the point cloud 130) to reference data 132. The reference data 132 can be a computer-aided design (CAD) model or a measurement of a so called "golden part." From this comparison (between the 3D measurement data (e.g., the point cloud 130) and the reference data 132), information about defects or discrepancies in the measurement data can be extracted. Such defects or discrepancies can indicate a dislocated part, a deformation (e.g., a dent or large scratch), or even a missing part of an object.

Although some techniques exist for performing basic point cloud-to-point cloud (or "cloud-to-cloud") comparison and/or point cloud-to-CAD model comparison, these approaches operate by comparing single points. Further, such approaches are susceptible to noise in the measurement data. When the measurement data is noisy (i.e., the noise is comparable to the expected/needed sensitivity in the comparison), false-positive detections are likely to be frequent while a high number of true defects go undetected.

Further, even a visual appearance of a bare cloud-to-cloud comparison is insufficient. The typical result for such visual inspection is the display of the point cloud where each point is colored or otherwise indicated based on its estimated distance to a corresponding reference point in the reference data. In the case of high noise, many points are determined to have a large distance. Hence, the display in the described manner is also noisy, and displacements of small features are undetectable by visual inspection.

For DMVS scanners, a typical 2-sigma noise might be 500 μm at a 500 mm measurement distance. In some applications, sensitivity for finding defects may be less than the 2-sigma noise (e.g., less than 500 μm such as about 300 μm).

Although some conventional approaches attempt to apply point cloud filters to mitigate noise, these approaches alter the actual measured data. This causes edges and other high frequency features to be deformed after smoothing.

To address these and other shortcomings of the prior art, one or more embodiments described herein use groups of points (referred to as "clusters") for comparison. That is, the present techniques do not look at individual point-by-point distance comparison but instead work on clusters or groups of data points. Because multiple points (i.e., clusters) are investigated at once, the effect of noise is significantly reduced. Further, one or more embodiments described herein perform region growing to an identified displaced cluster(s). This helps to identify a complete sub-part (e.g., a screw, a nut, a pin, etc.) of an object as displaced, which simplifies subsequent analysis of the measurement and highlights the complete displaced object in the data.

The one or more embodiments described herein provide numerous technical advantages over the prior art. For example, displaced point cloud segments with a sensitivity below typical measurement noise can be detected. False positive filtering is also provided. Segmentation of a shifted part can be identified for simplified further processing and analysis. Additionally, data does not need to be smoothed as in conventional approaches, which avoids deformation typically associated with conventional point cloud filtering approaches.

The embodiments of the present disclosure, facilitate improvement to computing technology, and particularly to techniques used for scanning an environment using 3D scanners and then evaluating the scanned data. For example, the present techniques evaluate point cloud data generated by a 3D scanner to determine defects and/or displacements of an object. Such defects and/or displacements may not be observable to a human observer because they are too small to detect with the human eye, for example, or cannot be observed in data because the data is noisy to the same or similar order of magnitude as the defect/displacement. By performing cluster-based cloud-to-cloud comparisons, defects and/or displacements that are otherwise undetectable by human visual inspections or in noisy measurement data can be detected. This improves computing technology and further represents a practical application that facilitates object evaluation.

Figure 2:
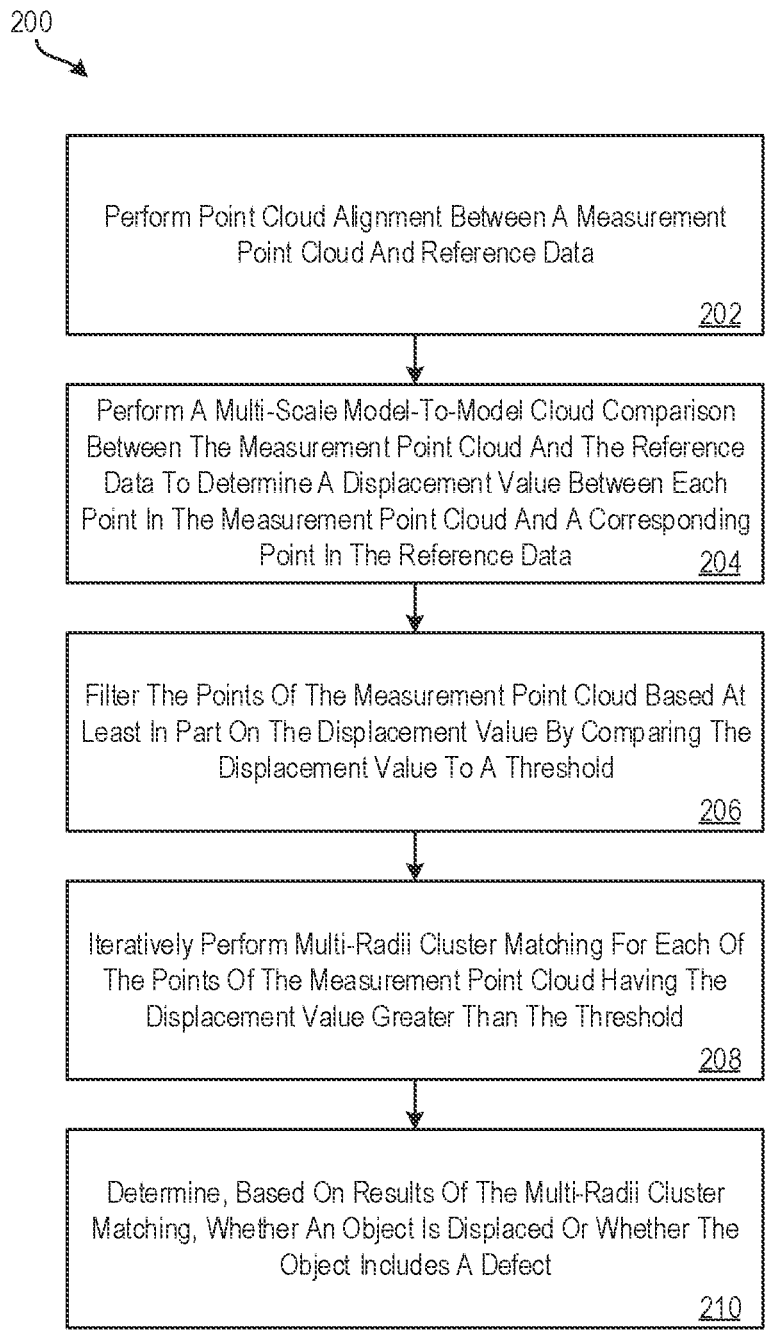
FIG. 2 depicts a flow diagram of a method for detecting displacements in a point cloud using cluster-based cloud-to-cloud comparison according to one or more embodiments described herein.

FIG. 2 depicts a flow diagram of a method 200 for detecting displacements in a point cloud using cluster-based cloud-to-cloud comparison according to one or more embodiments described herein. The method 200 can be performed by any suitable processing system or device, such as the computing device 110 for example.

At block 202, the computing device 110 performs point cloud alignment between a measurement point cloud and reference data, such as an alignment of the point cloud to a computer-aided-design model or a golden master point cloud for example. At block 204, the computing device 110 performs a multi-scale model-to-model cloud comparison between the measurement point cloud and the reference data to determine a displacement value between each point in the measurement point cloud and a corresponding point in the reference data. At block 206, the computing device 110 filters the points of the measurement point cloud based at least in part on the displacement value by comparing the displacement value to a threshold. At block 208, the computing device 110 iteratively performs multi-radii cluster matching for each of the points of the measurement point cloud having the displacement value greater than the threshold. At block 210, the computing device determines, based on results of the multi-radii cluster matching, whether an object is displaced or whether the object includes a defect.

Additional processes also may be included, and it should be understood that the process depicted in FIG. 2 represents an illustration, and that other processes may be added or existing processes may be removed, modified, or rearranged without departing from the scope of the present disclosure.

Figure 3:
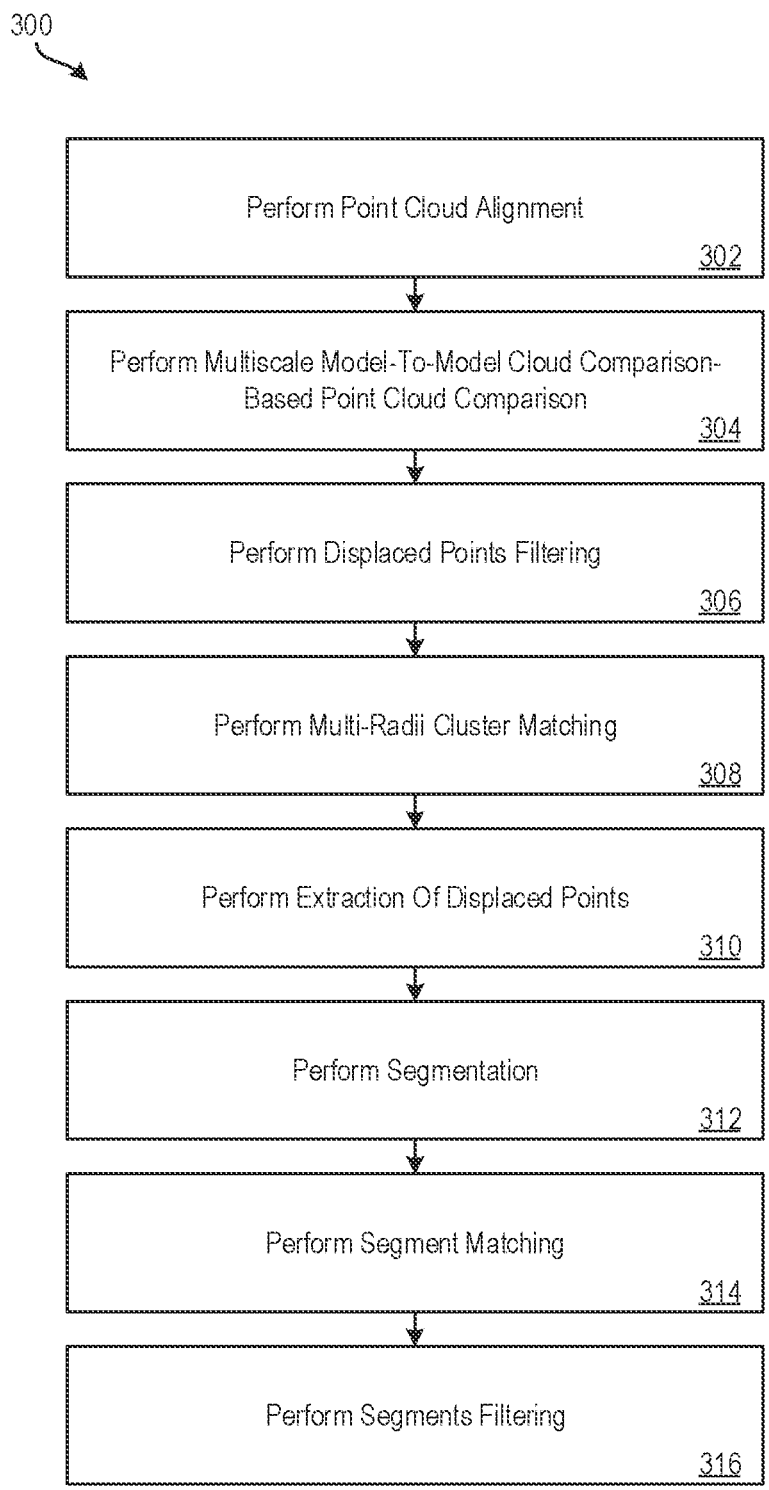
FIG. 3 depicts a flow diagram of a method for detecting displacements in a point cloud using cluster-based cloud-to-cloud comparison according to one or more embodiments described herein.
Figure 4:
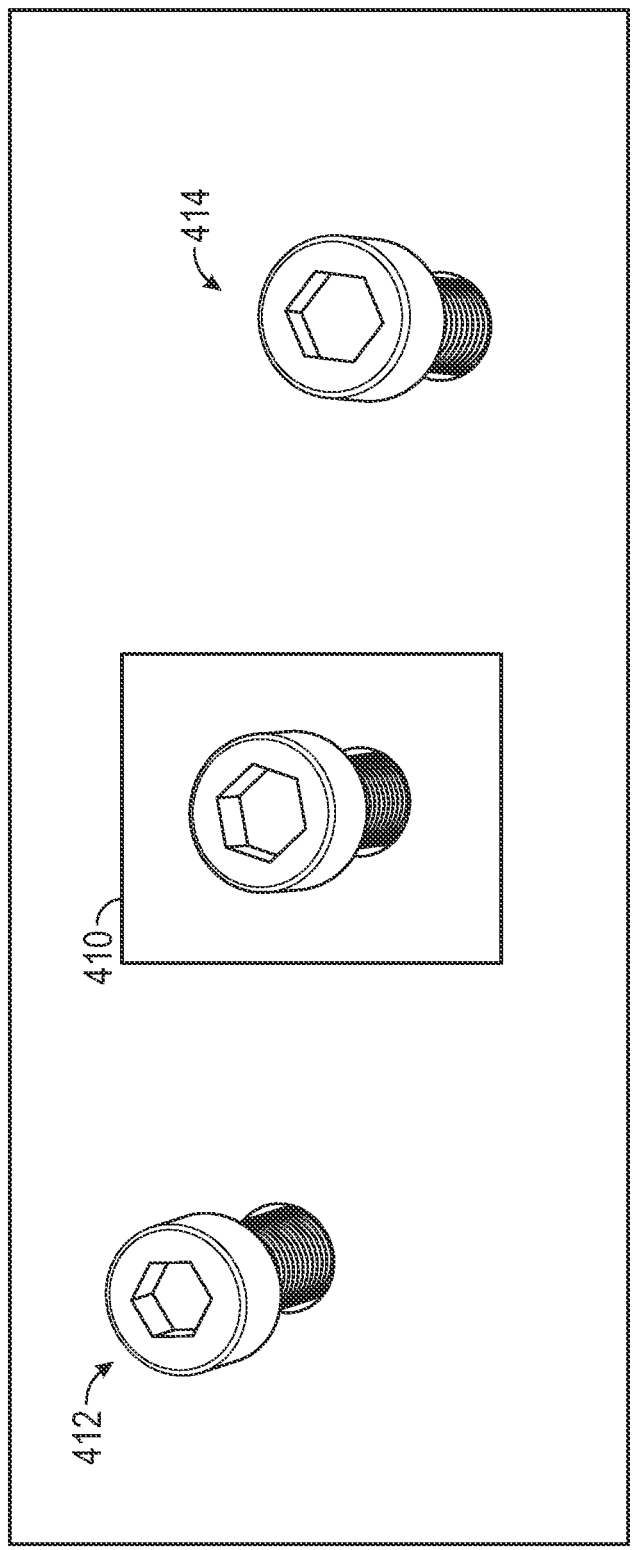
FIG. 4 depicts an example of three fasteners including a displaced fastener and two non-displaced fasteners that are scanned to generate a point cloud according to one or more embodiments described herein.

FIG. 3 depicts a flow diagram of a method 300 for detecting displacements in a point cloud using cluster-based cloud-to-cloud comparison according to one or more embodiments described herein. The method 300 can be performed by any suitable processing system or device, such as the computing device 110 for example. The method 300 is now described with respect to FIGS. 3-10. As an example, the method 300 is described with respect to a displaced fastener 410 (e.g. a machine screw) as shown in FIG. 4. Particularly, FIG. 4 depicts three fasteners: the displaced fastener 410 and non-displaced fasteners 412, 414. As shown, the displaced fastener 410 is rotated one-half turn less relative to the non-displaced fasteners 412, 414. The method 300 enables the computing device 110 to detect that the displaced fastener 410 is displaced by performing cluster-based cloud-to-cloud comparison.

At block 302, the computing device 110 receives a point cloud 130 from a scanner 120 (or from another source, such as another scanner or database) and performs point cloud alignment. Given the point cloud data of a golden part (i.e., the reference data 132), which acts as ground truth, and a scan data (e.g., the point cloud 130) captured about a test part (i.e., the displaced fastener 410 and the non-displaced fasteners 412, 414), the computing device 110 aligns and registers both the point clouds for analysis. That is, the computing device 110 aligns and registers the measured point cloud data (e.g., the point cloud 130) with a point cloud generated from a golden part (i.e., the reference data 132). As a result, each point in the point cloud 130 is associated with a corresponding point in the reference data 132.

Figure 5:
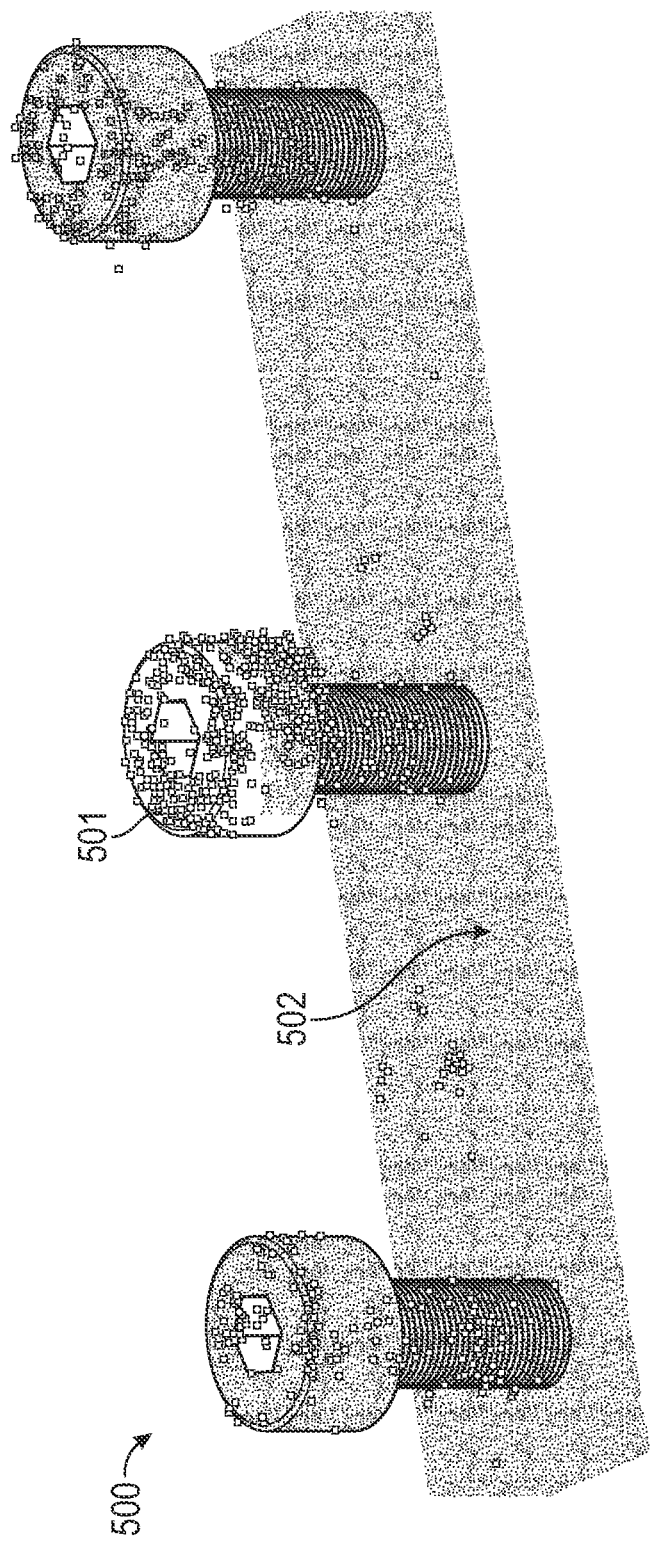
FIG. 5 depicts a point cloud of results of applying multiscale model-to-model cloud comparison-based (M3C2) point cloud comparison according to one or more embodiments described herein.

At block 304, the computing device 110 performs a multiscale model-to-model cloud comparison-based (M3C2) point cloud comparison. M3C2 compares the points along the surface normal resulting in a signed distance value. The result after applying M3C2 comparison is shown in FIG. 5. In particular, FIG. 5 depicts a point cloud 500 of results of applying M3C2 according to one or more embodiments described herein. Each point is colored based on its displacement value (also referred to as an "M3C2 distance") obtained by the M3C2 comparison.

At block 306, the computing device 110 performs displaced points filtering. To do this, the points from the M3C2 at block 304 are compared to a threshold. Points with an M3C2 distance greater than the threshold are selected. For an example using a DMVS scanner, the threshold may be set to 250 μm. In other examples, other threshold values can be set. The points greater than the threshold are then sorted in descending order based on the M3C2 distance to form a displaced points set. The point cloud 500 of FIG. 5 includes points above the threshold 501 and points below the threshold 502.

At block 308, the computing device 110 performs multi-radii cluster matching. Each point from the displaced points set is used as a test point, and the multi-radii cluster matching is performed on each of those points. For each point (the "test point"), a test cluster is formed by considering the test point's neighbors from the point cloud 130 falling within a radius R. A reference cluster is formed by considering the reference neighbors falling within radius 2*R of the point in the reference point cloud (generated from the reference data 132) that is associated with the test point.

Then, an iterative closest point (ICP) technique is applied to match the points in the test cluster to the points in the reference cluster. ICP based cluster matching results in a transformation matrix (for example see transformation matrix 621 in FIG. 6C). The transformation matrix is used to calculate a new displacement value and a displacement vector. Then, the M3C2 distance values are updated with the new displacement values. The new displacement value is obtained by calculating the centroid of the test cluster points resulting in centroid A. Then, the transformation matrix is applied on the test cluster points to calculate the new transformed point's centroid B. The difference between centroid A and centroid B yields the displacement vector (for example see displacement vector 622 in FIG. 6C), and the Euclidean distance between these centroids results in the new displacement value.

Figure 6A:
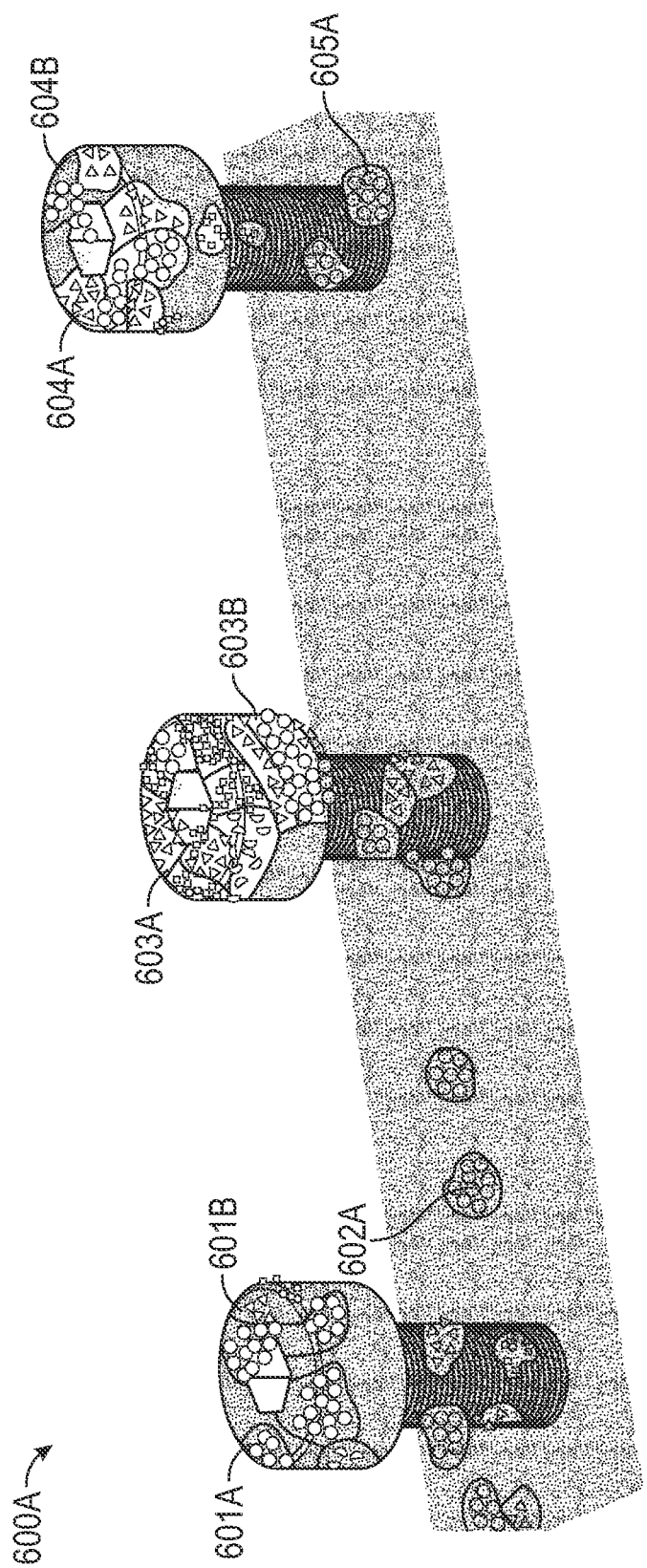
FIGS. 6A, 6B, 6C, 6D depict point clouds of cluster matching for test clusters for radius values of 250 μm, 500 μm, 1000 μm, and 1500 μm respectively compared to their respective reference data according to one or more embodiments described herein.
Figure 6B:
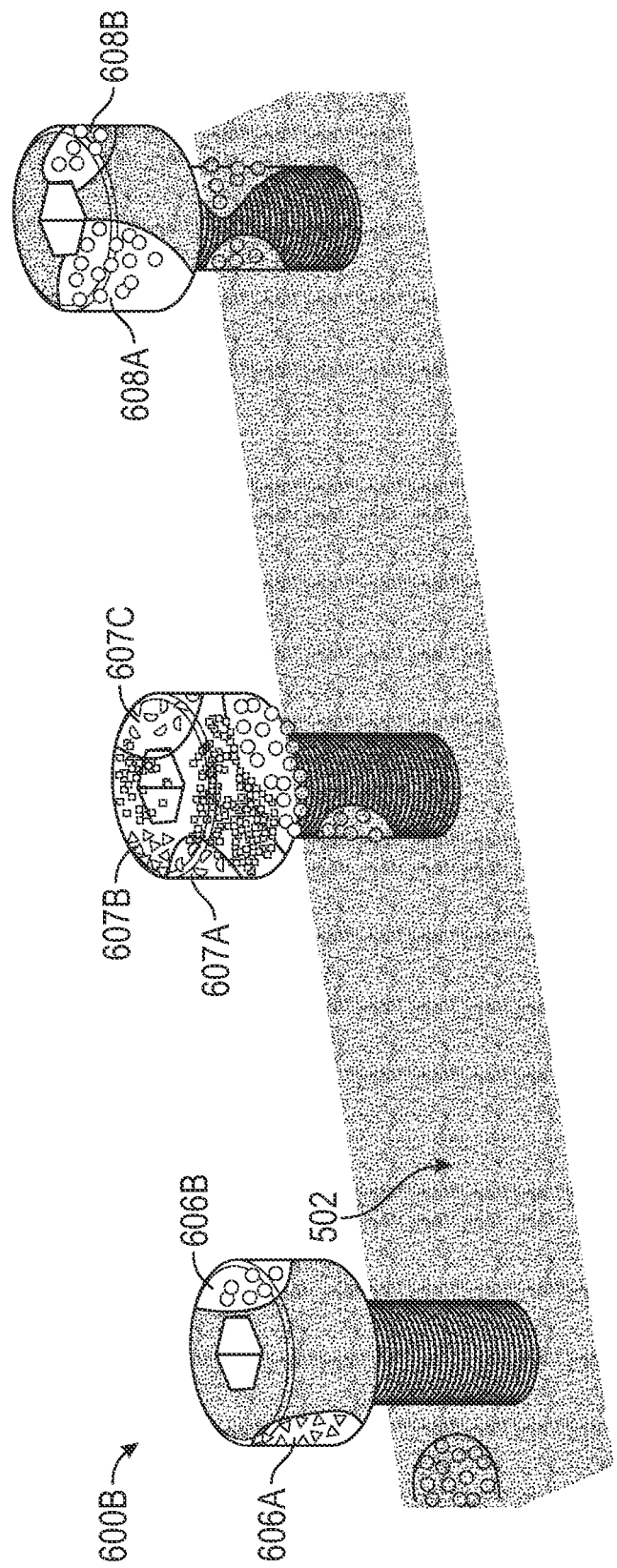
Figure 6C:
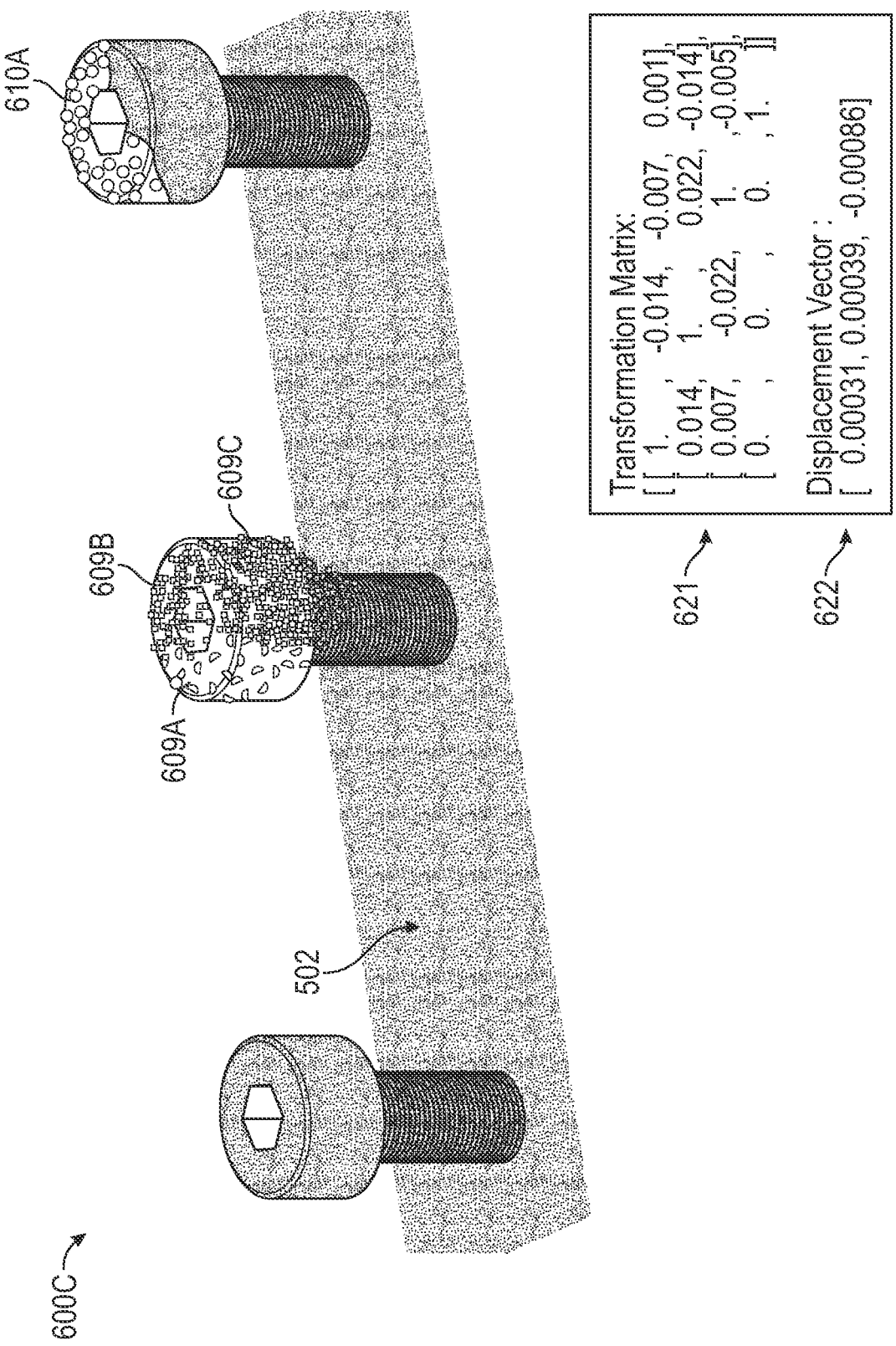
Figure 6D:
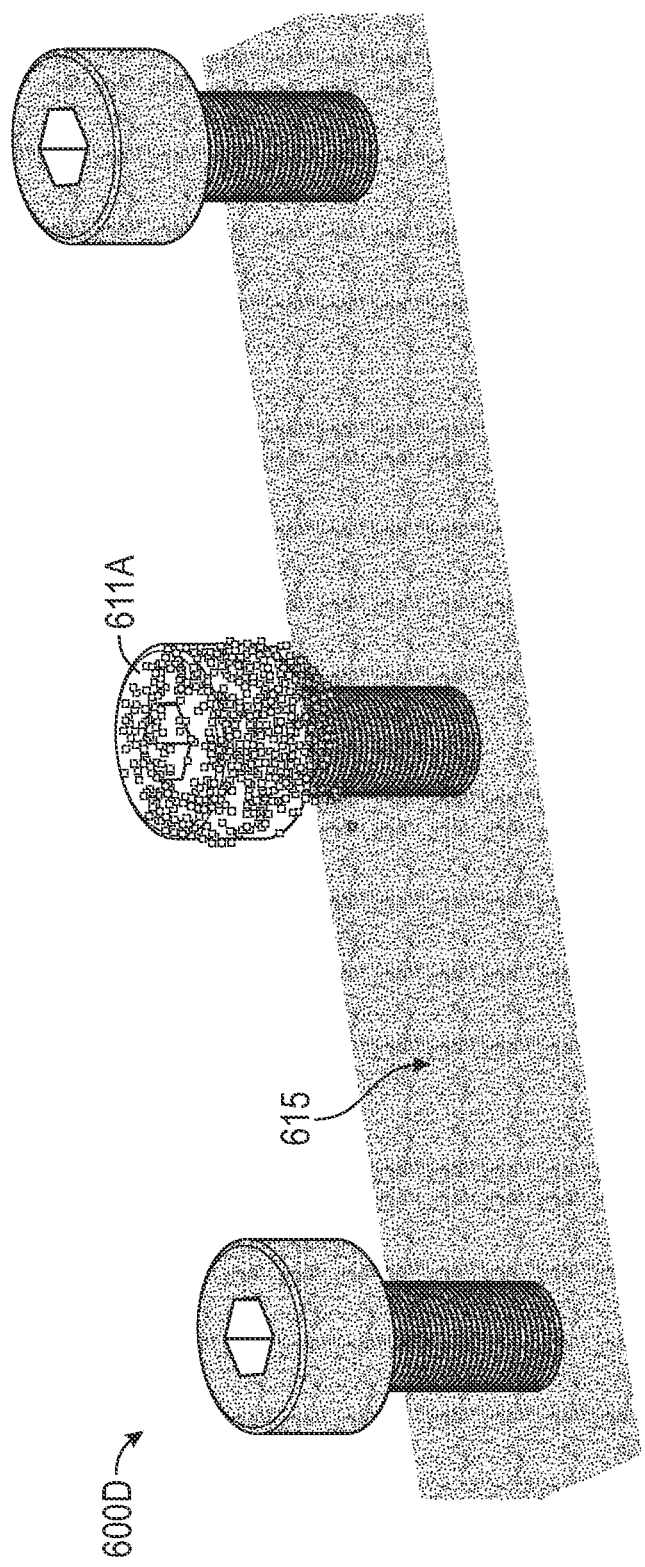

According to one or more embodiments described herein, FIGS. 6A, 6B, 6C, 6D depict point clouds 600A, 600B, 600C, 600D of cluster matching for test clusters for radius values of 250 μm, 500 μm, 1000 μm, and 1500 μm respectively compared to their associated reference data. Each point is colored or otherwise indicated based on the calculated new distance between test cluster points and reference cluster points. To extract small and large dislocated regions in the point cloud 130, cluster matching can be performed with multiple different radius values (such as those shown in FIGS. 6A-6D). Examples of dislocated regions in the point cloud 130 are shown in FIGS. 6A-6D as Region 601A, Region 601B, Region 602A, Region 603A, Region 603B, Region 604A, Region 604B, Region 605A, Region 606A, Region 606B, Region 607A, Region 607B, Region 607C, Region 608A, Region 608B, Region 609A, Region 609B, Region 609C, Region 610A, and Region 611A. By selecting the radius values, the potentially displaced regions from the point cloud 130 are collected. Although described as "multi-radii," it should be appreciated that one or more radii may be used. For example, four different radius values, such as those shown in FIGS. 6A-6D, can be used. However, in other examples, other numbers of radius values can be used (e.g., 1 radius value, 2 radius values, 3 radius values, 4 radius values, 5 radius values, 6 radius values, etc.). The transformation matrix 621 and the displacement vector 622 obtained after matching the points in the cluster represented as Region 604C to the reference cluster points are depicted in FIG. 6C. In FIG. 6D, displaced points are shown as the points in the Region 611A and non-displaced ("good") points are shown as the points 615.

At block 310, the computing device 110 performs extraction of displaced points. Here the displaced points are obtained with more confidence by comparing the points in different radius cluster matching results and removing some of the points that are categorized as displaced because of noise in the data. The results obtained from multi-radii cluster matching from block 308 (in this example, done with four different radii values as depicted in FIGS. 6A-6D) are used to perform this filtering. Common displaced points are obtained by comparing two of the multi-radii cluster matching. For example, commonly displaced points are obtained from a first radius (e.g., FIG. 6A) and a second radius (e.g., FIG. 6B) cluster matching resulting in Set 1. Similarly, common displaced points are obtained from a third radius (e.g., FIG. 6C) and a fourth radius (FIG. 6D) cluster matching resulting in Set 2. Then, Set 1 and Set 2 are combined as shown in FIG. 7. In particular, FIG. 7 depicts a point cloud 700 of the extracted displaced points in the displaced fastener example according to one or more embodiments described herein.

Figure 8:
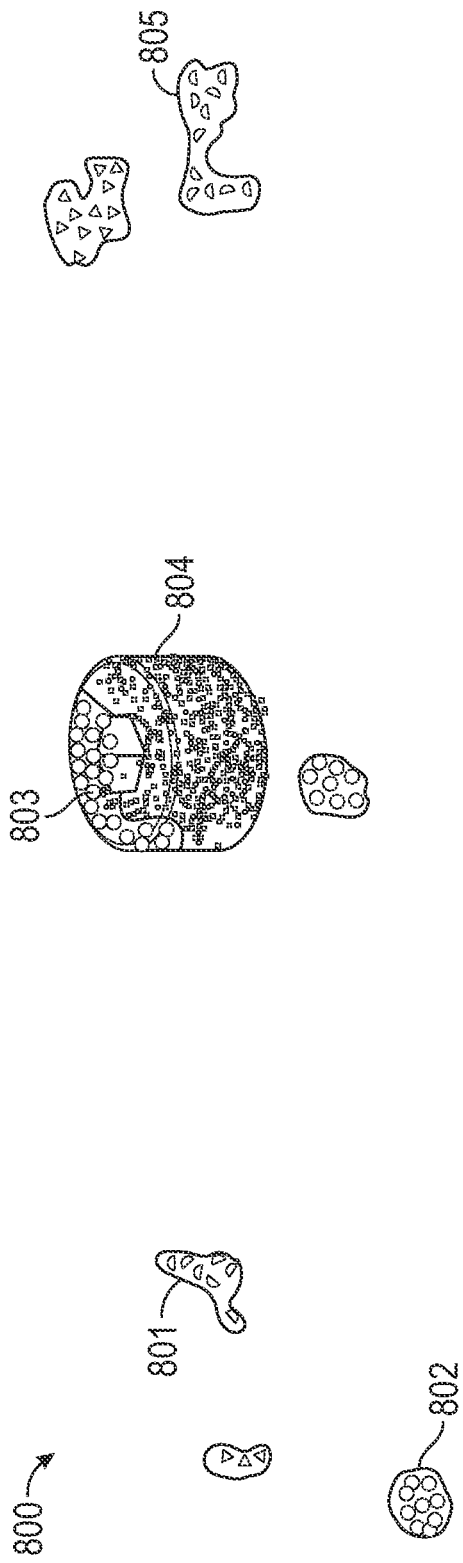
FIG. 8 depicts a point cloud of extracted displaced points after segmentation according to one or more embodiments described herein.

At block 312, the computing device 110 performs segmentation using region growing segmentation. Particularly, region growing segmentation is performed on the extracted displaced points of the point cloud 700 of FIG. 7 to segment the deformed/dislocated part and calculate its displacement value. FIG. 8 depicts a point cloud 800 of extracted displaced points after segmentation according to one or more embodiments described herein. In FIG. 8, each segment group is represented by different shapes as Region 801, Region 802, Region 803, Region 804, and Region 805. In an embodiment, the region growing segmentation is based on a normal vector for each point. In this embodiment, where there is a smooth transition of the normal vectors, the points are grouped together.

Figure 9:
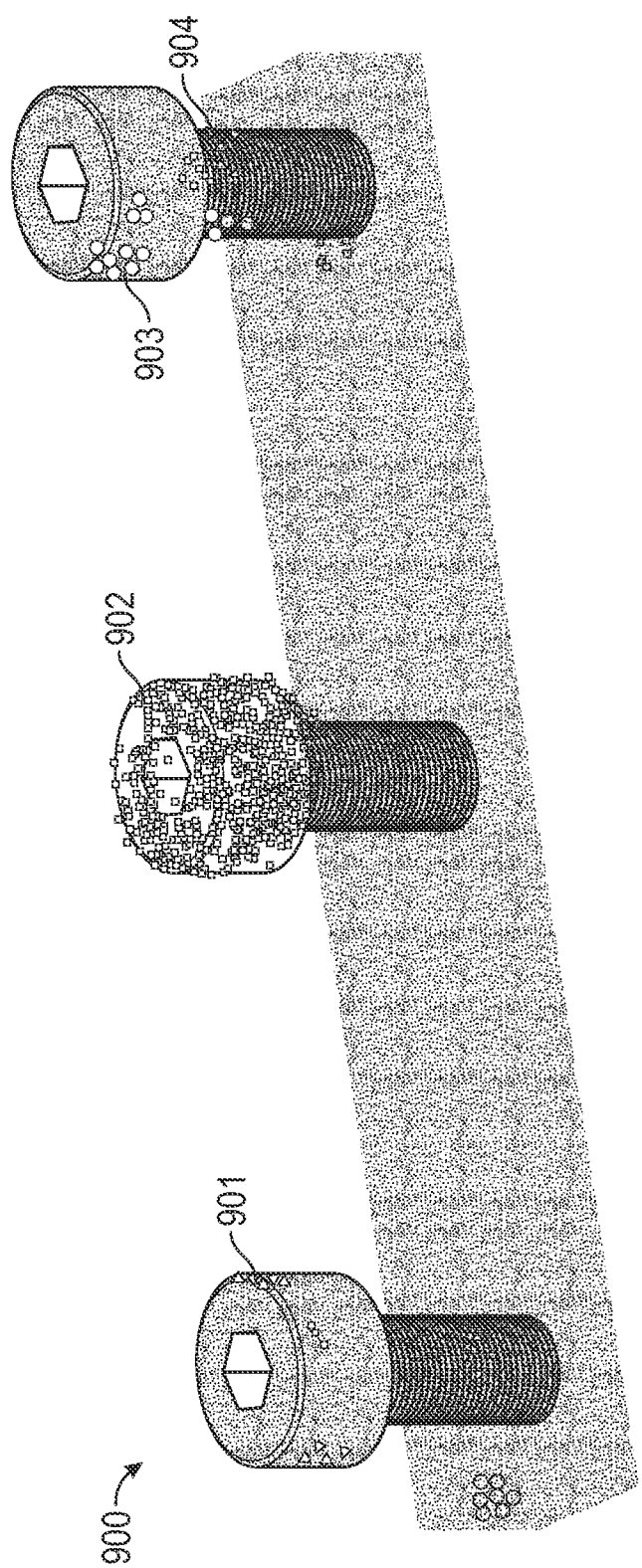
FIG. 9 depicts a point cloud of updated displacement information after segment matching according to one or more embodiments described herein.
Figure 10:
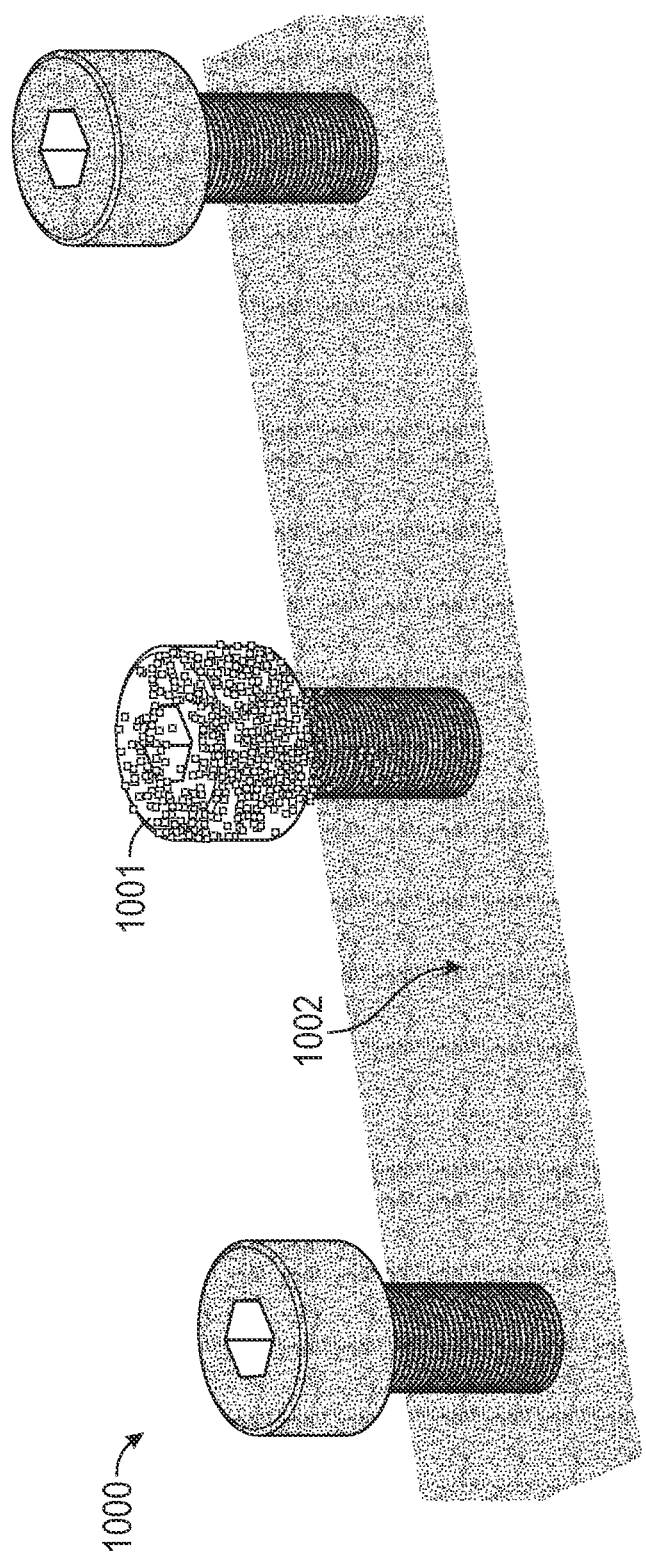
FIG. 10 depicts a point cloud of final results after applying a segments filter according to one or more embodiments described herein.
Figure 11E:
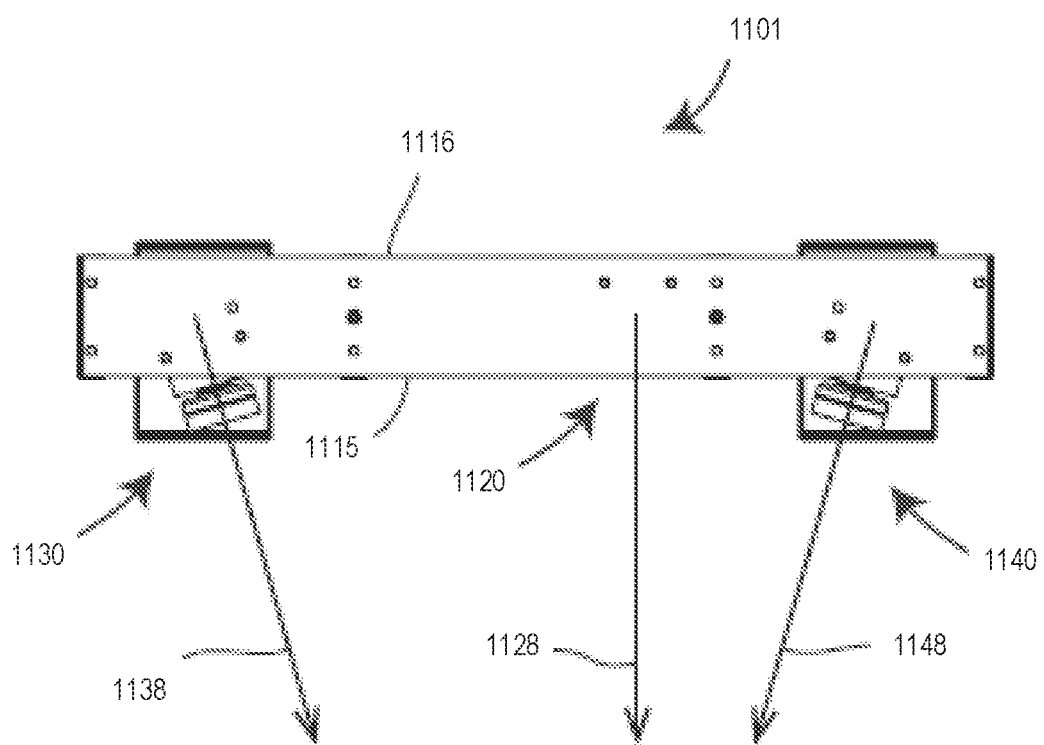

At block 314, the computing device 110 performs segment matching. On the obtained segmented regions, ICP is used to match each segment points with a corresponding reference points in the reference data to check if the segment is displaced with respect to the corresponding reference or not. If so, the displacement values for each of the points in the segment is updated using the transformation matrix obtained by segment matching. The updated displacement information after segment matching is depicted in FIG. 9 as point cloud 900 where Region 902 is a true-positive segment on which the displacement has been applied and Regions 901, 903, and 904 are false-positive segments.

After segment matching at block 314, the computing device 110 at block 316 performs segments filtering to remove false-positive segments. False-positive segments are segments classified as displaced and are removed using M3C2 distance filtering and segments point density. For example, M3C2 signed distances values of the points in the segment are determined and the points whose distance value is less than ±150 μm are split, resulting in a first set and points whose distance value is greater than ±150 μm resulting in a second set. On these new sets (the first set and the second set), the median of the second set's point's M3C2 distance values is calculated. The ratio of the number of points in the first set and the second set is also calculated. Based on these calculations, the segments are then categorized. As an example, if the ratio is less than 2 and the median value is greater than 250 μm, then the segments are categorized as true positives. In some examples, sparse false-positive segments are removed if the point density of the segment is less than a threshold limit. The final result after applying the segments filter is shown as point cloud 10 in FIG. 10 where displaced points are shown as the points 1001 and non-displaced ("good") points are shown as the points 1002. In some examples, other values besides the median value can be used, such as a mean value, a standard deviation, a median of an absolute distance, etc.

Additional processes also may be included, and it should be understood that the process depicted in FIG. 3 represents an illustration, and that other processes may be added or existing processes may be removed, modified, or rearranged without departing from the scope of the present disclosure.

Turning now to FIG. 11, it may be desired to capture three-dimensional (3D) measurements of objects. For example, the point cloud 130 of FIG. 1 may be captured by the scanner 120. One such example of the scanner 120 is now described. Such example scanner is referred to as a DVMS scanner by FARO®.

In an embodiment illustrated in FIGS. 11A, 11B, 11C, 11D, a triangulation scanner 1101 includes a body 1105, a projector 1120, a first camera 1130, and a second camera 1140. In an embodiment, the projector optical axis 1122 of the projector 1120, the first-camera optical axis 1132 of the first camera 1130, and the second-camera optical axis 1142 of the second camera 1140 all lie on a common plane 1150, as shown in FIGS. 11C, 11D. In some embodiments, an optical axis passes through a center of symmetry of an optical system, which might be a projector or a camera, for example. For example, an optical axis may pass through a center of curvature of lens surfaces or mirror surfaces in an optical system. The common plane 1150, also referred to as a first plane 1150, extends perpendicular into and out of the paper in FIG. 1D.

In an embodiment, the body 1105 includes a bottom support structure 1106, a top support structure 1107, spacers 1108, camera mounting plates 1109, bottom mounts 1110, dress cover 1111, windows 1112 for the projector and cameras, Ethernet connectors 1113, and GPIO connector 1114. In addition, the body includes a front side 1115 and a back side 1116. In an embodiment, the bottom support structure 1106 and the top support structure 1107 are flat plates made of carbon-fiber composite material. In an embodiment, the carbon-fiber composite material has a low coefficient of thermal expansion (CTE). In an embodiment, the spacers 1108 are made of aluminum and are sized to provide a common separation between the bottom support structure 1106 and the top support structure 1107.

In an embodiment, the projector 1120 includes a projector body 1124 and a projector front surface 1126. In an embodiment, the projector 1120 includes a light source 1125 that attaches to the projector body 1124 that includes a turning mirror and a diffractive optical element (DOE), as explained herein below with respect to FIGS. 15A, 15B, 15C. The light source 1125 may be a laser, a superluminescent diode, or a partially coherent LED, for example. In an embodiment, the DOE produces an array of spots arranged in a regular pattern. In an embodiment, the projector 1120 emits light at a near infrared wavelength.

In an embodiment, the first camera 1130 includes a first-camera body 1134 and a first-camera front surface 36. In an embodiment, the first camera includes a lens, a photosensitive array, and camera electronics. The first camera 1130 forms on the photosensitive array a first image of the uncoded spots projected onto an object by the projector 1120. In an embodiment, the first camera responds to near infrared light.

In an embodiment, the second camera 1140 includes a second-camera body 1144 and a second-camera front surface 1146. In an embodiment, the second camera includes a lens, a photosensitive array, and camera electronics. The second camera 1140 forms a second image of the uncoded spots projected onto an object by the projector 1120. In an embodiment, the second camera responds to light in the near infrared spectrum. In an embodiment, a processor 1102 is used to determine 3D coordinates of points on an object according to methods described herein below. The processor 1102 may be included inside the body 1105 or may be external to the body. In further embodiments, more than one processor is used. In still further embodiments, the processor 1102 may be remotely located from the triangulation scanner.

FIG. 1E is a top view of the triangulation scanner 1101. A projector ray 1128 extends along the projector optical axis from the body of the projector 1124 through the projector front surface 1126. In doing so, the projector ray 1128 passes through the front side 1115. A first-camera ray 1138 extends along the first-camera optical axis 1132 from the body of the first camera 1134 through the first-camera front surface 1136. In doing so, the front-camera ray 1138 passes through the front side 1115. A second-camera ray 1148 extends along the second-camera optical axis 1142 from the body of the second camera 1144 through the second-camera front surface 1146. In doing so, the second-camera ray 1148 passes through the front side 1115.

Figure 12A:
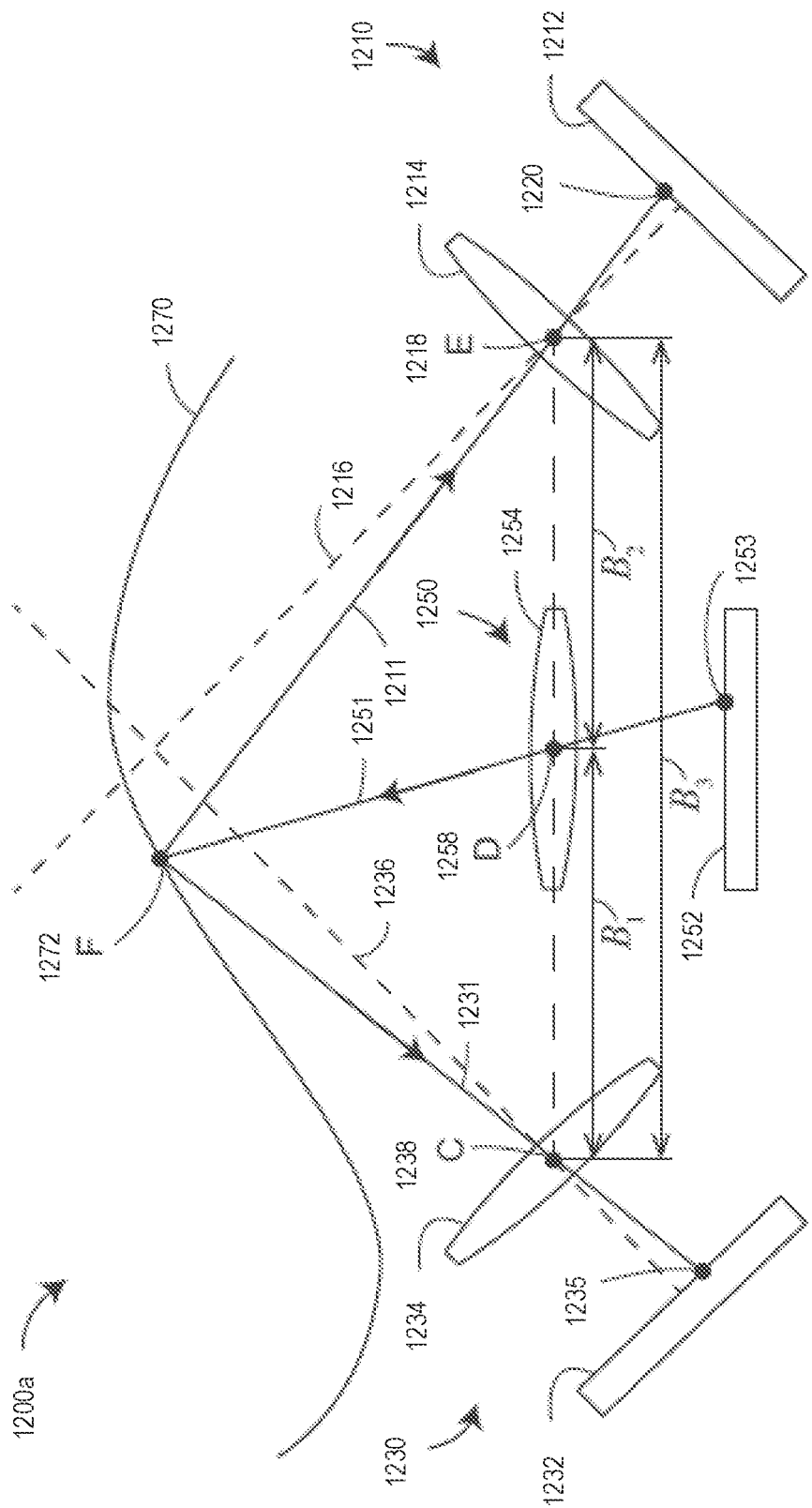
FIG. 12A is a schematic view of a triangulation scanner having a projector, a first camera, and a second camera according to one or more embodiments described herein.

FIG. 12A shows elements of a triangulation scanner 1200a that might, for example, be the triangulation scanner 1101 shown in FIGS. 11A, 11B, 11C, 11D, 11E. In an embodiment, the triangulation scanner 1200a includes a projector 1250, a first camera 1210, and a second camera 1230. In an embodiment, the projector 1250 creates a pattern of light on a pattern generator plane 1252. An exemplary corrected point 1253 on the pattern projects a ray of light 1251 through the perspective center 1258 (point D) of the lens 1254 onto an object surface 1270 at a point 1272 (point F). The point 1272 is imaged by the first camera 1210 by receiving a ray of light from the point 1272 through the perspective center 1218 (point E) of the lens 1214 onto the surface of a photosensitive array 1212 of the camera as a corrected point 1220. The point 1220 is corrected in the read-out data by applying a correction value to remove the effects of lens aberrations. The point 1272 is likewise imaged by the second camera 1230 by receiving a ray of light from the point 1272 through the perspective center 1238 (point C) of the lens 1234 onto the surface of the photosensitive array 1232 of the second camera as a corrected point 1235. It should be understood that as used herein any reference to a lens includes any type of lens system whether a single lens or multiple lens elements, including an aperture within the lens system. It should be understood that any reference to a projector in this document refers not only to a system projecting with a lens or lens system an image plane to an object plane. The projector does not necessarily have a physical pattern-generating plane 1252 but may have any other set of elements that generate a pattern. For example, in a projector having a DOE, the diverging spots of light may be traced backward to obtain a perspective center for the projector and also to obtain a reference projector plane that appears to generate the pattern. In most cases, the projectors described herein propagate uncoded spots of light in an uncoded pattern. However, a projector may further be operable to project coded spots of light, to project in a coded pattern, or to project coded spots of light in a coded pattern. In other words, in some aspects of the disclosed embodiments, the projector is at least operable to project uncoded spots in an uncoded pattern but may in addition project in other coded elements and coded patterns.

In an embodiment where the triangulation scanner 1200a of FIG. 12A is a single-shot scanner that determines 3D coordinates based on a single projection of a projection pattern and a single image captured by each of the two cameras, then a correspondence between the projector point 1253, the image point 1220, and the image point 1235 may be obtained by matching a coded pattern projected by the projector 1250 and received by the two cameras 1210, 1230. Alternatively, the coded pattern may be matched for two of the three elements—for example, the two cameras 1210, 1230 or for the projector 1250 and one of the two cameras 1210 or 1230. This is possible in a single-shot triangulation scanner because of coding in the projected elements or in the projected pattern or both.

After a correspondence is determined among projected and imaged elements, a triangulation calculation is performed to determine 3D coordinates of the projected element on an object. For FIG. 12A, the elements are uncoded spots projected in a uncoded pattern. In an embodiment, a triangulation calculation is performed based on selection of a spot for which correspondence has been obtained on each of two cameras. In this embodiment, the relative position and orientation of the two cameras is used. For example, the baseline distance B3 between the perspective centers 1218 and 1238 is used to perform a triangulation calculation based on the first image of the first camera 1210 and on the second image of the second camera 1230. Likewise, the baseline B1 is used to perform a triangulation calculation based on the projected pattern of the projector 1250 and on the second image of the second camera 1230. Similarly, the baseline B2 is used to perform a triangulation calculation based on the projected pattern of the projector 1250 and on the first image of the first camera 1210. In an embodiment, the correspondence is determined based at least on an uncoded pattern of uncoded elements projected by the projector, a first image of the uncoded pattern captured by the first camera, and a second image of the uncoded pattern captured by the second camera. In an embodiment, the correspondence is further based at least in part on a position of the projector, the first camera, and the second camera. In a further embodiment, the correspondence is further based at least in part on an orientation of the projector, the first camera, and the second camera.

The term "uncoded element" or "uncoded spot" as used herein refers to a projected or imaged element that includes no internal structure that enables it to be distinguished from other uncoded elements that are projected or imaged. The term "uncoded pattern" as used herein refers to a pattern in which information is not encoded in the relative positions of projected or imaged elements. For example, one method for encoding information into a projected pattern is to project a quasi-random pattern of "dots" in which the relative position of the dots is known ahead of time and can be used to determine correspondence of elements in two images or in a projection and an image. Such a quasi-random pattern contains information that may be used to establish correspondence among points and hence is not an example of a uncoded pattern. An example of an uncoded pattern is a rectilinear pattern of projected pattern elements.

In an embodiment, uncoded spots are projected in an uncoded pattern as illustrated in the scanner system 12100 of FIG. 12B. In an embodiment, the scanner system 12100 includes a projector 12110, a first camera 12130, a second camera 12140, and a processor 12150. The projector projects an uncoded pattern of uncoded spots off a projector reference plane 12114. In an embodiment illustrated in FIGS. 12B and 12C, the uncoded pattern of uncoded spots is a rectilinear array 12111 of circular spots that form illuminated object spots 12121 on the object 12120. In an embodiment, the rectilinear array of spots 12111 arriving at the object 12120 is modified or distorted into the pattern of illuminated object spots 12121 according to the characteristics of the object 12120. An exemplary uncoded spot 12112 from within the projected rectilinear array 12111 is projected onto the object 12120 as a spot 12122. The direction from the projector spot 12112 to the illuminated object spot 12122 may be found by drawing a straight line 12124 from the projector spot 12112 on the reference plane 12114 through the projector perspective center 12116. The location of the projector perspective center 12116 is determined by the characteristics of the projector optical system.

In an embodiment, the illuminated object spot 12122 produces a first image spot 12134 on the first image plane 12136 of the first camera 12130. The direction from the first image spot to the illuminated object spot 12122 may be found by drawing a straight line 12126 from the first image spot 12134 through the first camera perspective center 12132. The location of the first camera perspective center 12132 is determined by the characteristics of the first camera optical system.

In an embodiment, the illuminated object spot 12122 produces a second image spot 12144 on the second image plane 12146 of the second camera 12140. The direction from the second image spot 12144 to the illuminated object spot 12122 may be found by drawing a straight line 12126 from the second image spot 12144 through the second camera perspective center 12142. The location of the second camera perspective center 12142 is determined by the characteristics of the second camera optical system.

In an embodiment, a processor 12150 is in communication with the projector 12110, the first camera 12130, and the second camera 12140. Either wired or wireless channels 12151 may be used to establish connection among the processor 12150, the projector 12110, the first camera 12130, and the second camera 12140. The processor may include a single processing unit or multiple processing units and may include components such as microprocessors, field programmable gate arrays (FPGAs), digital signal processors (DSPs), and other electrical components. The processor may be local to a scanner system that includes the projector, first camera, and second camera, or it may be distributed and may include networked processors. The term processor encompasses any type of computational electronics and may include memory storage elements.

Figure 12C:
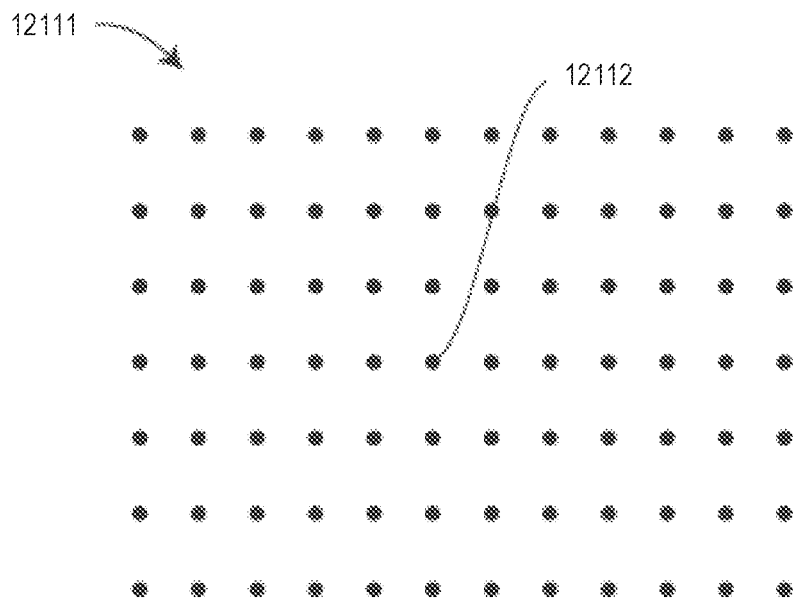
FIG. 12C is an example of an uncoded pattern of uncoded spots according to one or more embodiments described herein.
Figure 12D:
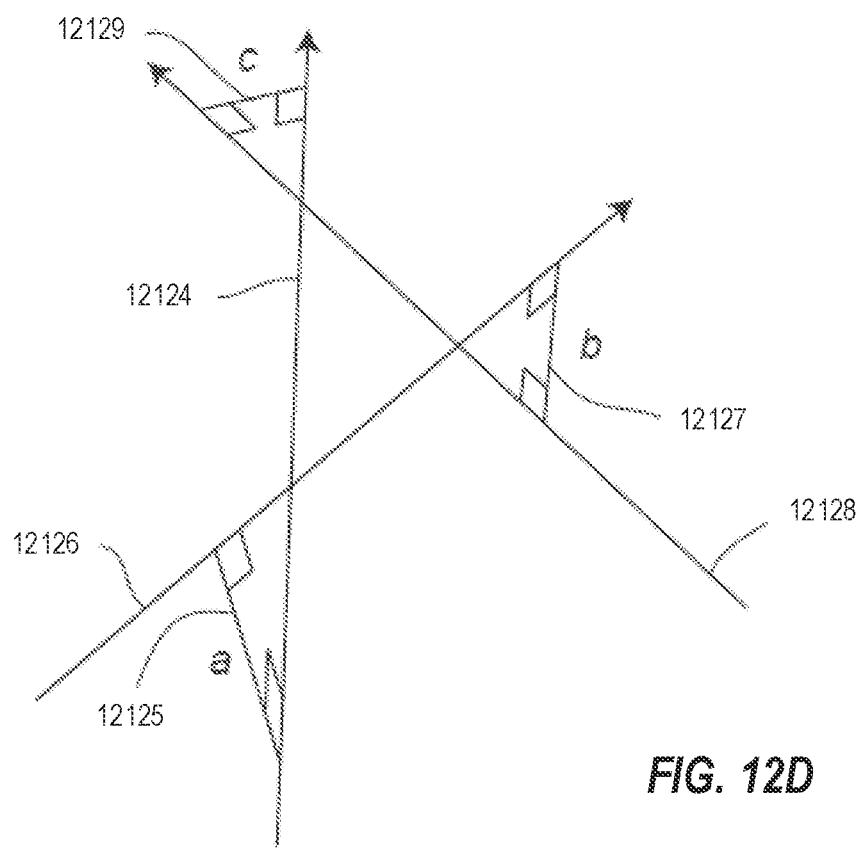
FIG. 12D is a representation of one mathematical method that might be used to determine a nearness of intersection of three lines according to one or more embodiments described herein.
Figure 12E:
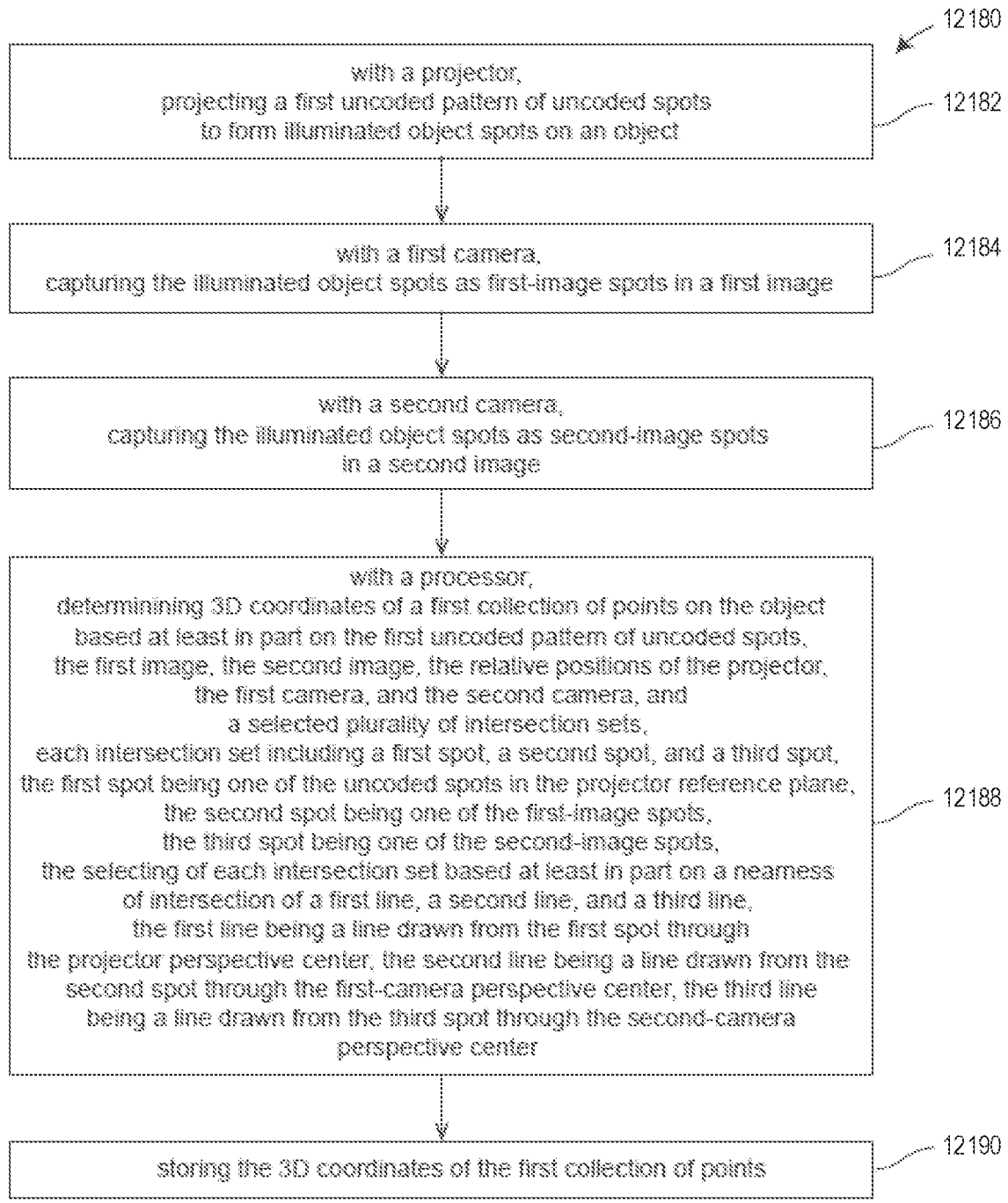
FIG. 12E is a list of elements in a method for determining 3D coordinates of an object according to one or more embodiments described herein.

FIG. 12E shows elements of a method 12180 for determining 3D coordinates of points on an object. An element 12182 includes projecting, with a projector, a first uncoded pattern of uncoded spots to form illuminated object spots on an object. FIGS. 12B, 12C illustrate this element 12182 using an embodiment 12100 in which a projector 12110 projects a first uncoded pattern of uncoded spots 12111 to form illuminated object spots 12121 on an object 12120.

A method element 12184 includes capturing with a first camera the illuminated object spots as first-image spots in a first image. This element is illustrated in FIG. 12B using an embodiment in which a first camera 12130 captures illuminated object spots 12121, including the first-image spot 12134, which is an image of the illuminated object spot 12122. A method element 12186 includes capturing with a second camera the illuminated object spots as second-image spots in a second image. This element is illustrated in FIG. 12B using an embodiment in which a second camera 140 captures illuminated object spots 12121, including the second-image spot 12144, which is an image of the illuminated object spot 12122.

A first aspect of method element 12188 includes determining with a processor 3D coordinates of a first collection of points on the object based at least in part on the first uncoded pattern of uncoded spots, the first image, the second image, the relative positions of the projector, the first camera, and the second camera, and a selected plurality of intersection sets. This aspect of the element 12188 is illustrated in FIGS. 12B, 12C using an embodiment in which the processor 12150 determines the 3D coordinates of a first collection of points corresponding to object spots 12121 on the object 12120 based at least in the first uncoded pattern of uncoded spots 12111, the first image 12136, the second image 12146, the relative positions of the projector 12110, the first camera 12130, and the second camera 12140, and a selected plurality of intersection sets. An example from FIG. 12B of an intersection set is the set that includes the points 12112, 12134, and 12144. Any two of these three points may be used to perform a triangulation calculation to obtain 3D coordinates of the illuminated object spot 12122 as discussed herein above in reference to FIGS. 12A, 12B.

A second aspect of the method element 12188 includes selecting with the processor a plurality of intersection sets, each intersection set including a first spot, a second spot, and a third spot, the first spot being one of the uncoded spots in the projector reference plane, the second spot being one of the first-image spots, the third spot being one of the second-image spots, the selecting of each intersection set based at least in part on the nearness of intersection of a first line, a second line, and a third line, the first line being a line drawn from the first spot through the projector perspective center, the second line being a line drawn from the second spot through the first-camera perspective center, the third line being a line drawn from the third spot through the second-camera perspective center. This aspect of the element 12188 is illustrated in FIG. 12B using an embodiment in which one intersection set includes the first spot 12112, the second spot 12134, and the third spot 12144. In this embodiment, the first line is the line 12124, the second line is the line 12126, and the third line is the line 12128. The first line 12124 is drawn from the uncoded spot 12112 in the projector reference plane 12114 through the projector perspective center 12116. The second line 12126 is drawn from the first-image spot 12134 through the first-camera perspective center 12132. The third line 12128 is drawn from the second-image spot 12144 through the second-camera perspective center 12142. The processor 12150 selects intersection sets based at least in part on the nearness of intersection of the first line 12124, the second line 12126, and the third line 12128.

The processor 12150 may determine the nearness of intersection of the first line, the second line, and the third line based on any of a variety of criteria. For example, in an embodiment, the criterion for the nearness of intersection is based on a distance between a first 3D point and a second 3D point. In an embodiment, the first 3D point is found by performing a triangulation calculation using the first image point 12134 and the second image point 12144, with the baseline distance used in the triangulation calculation being the distance between the perspective centers 12132 and 12142. In the embodiment, the second 3D point is found by performing a triangulation calculation using the first image point 12134 and the projector point 12112, with the baseline distance used in the triangulation calculation being the distance between the perspective centers 12134 and 12116. If the three lines 12124, 12126, and 12128 nearly intersect at the object point 12122, then the calculation of the distance between the first 3D point and the second 3D point will result in a relatively small distance. On the other hand, a relatively large distance between the first 3D point and the second 3D would indicate that the points 12112, 12134, and 12144 did not all correspond to the object point 12122.

As another example, in an embodiment, the criterion for the nearness of the intersection is based on a maximum of closest-approach distances between each of the three pairs of lines. This situation is illustrated in FIG. 12D. A line of closest approach 12125 is drawn between the lines 12124 and 12126. The line 12125 is perpendicular to each of the lines 12124, 12126 and has a nearness-of-intersection length a. A line of closest approach 12127 is drawn between the lines 12126 and 12128. The line 12127 is perpendicular to each of the lines 12126, 12128 and has length b. A line of closest approach 12129 is drawn between the lines 12124 and 12128. The line 12129 is perpendicular to each of the lines 12124, 12128 and has length c. According to the criterion described in the embodiment above, the value to be considered is the maximum of a, b, and c. A relatively small maximum value would indicate that points 12112, 12134, and 12144 have been correctly selected as corresponding to the illuminated object point 12122. A relatively large maximum value would indicate that points 12112, 12134, and 12144 were incorrectly selected as corresponding to the illuminated object point 12122.

The processor 12150 may use many other criteria to establish the nearness of intersection. For example, for the case in which the three lines were coplanar, a circle inscribed in a triangle formed from the intersecting lines would be expected to have a relatively small radius if the three points 12112, 12134, 12144 corresponded to the object point 12122. For the case in which the three lines were not coplanar, a sphere having tangent points contacting the three lines would be expected to have a relatively small radius.

It should be noted that the selecting of intersection sets based at least in part on a nearness of intersection of the first line, the second line, and the third line is not used in most other projector-camera methods based on triangulation. For example, for the case in which the projected points are coded points, which is to say, recognizable as corresponding when compared on projection and image planes, there is no need to determine a nearness of intersection of the projected and imaged elements. Likewise, when a sequential method is used, such as the sequential projection of phase-shifted sinusoidal patterns, there is no need to determine the nearness of intersection as the correspondence among projected and imaged points is determined based on a pixel-by-pixel comparison of phase determined based on sequential readings of optical power projected by the projector and received by the camera(s). The method element 12190 includes storing 3D coordinates of the first collection of points.

Figure 13:
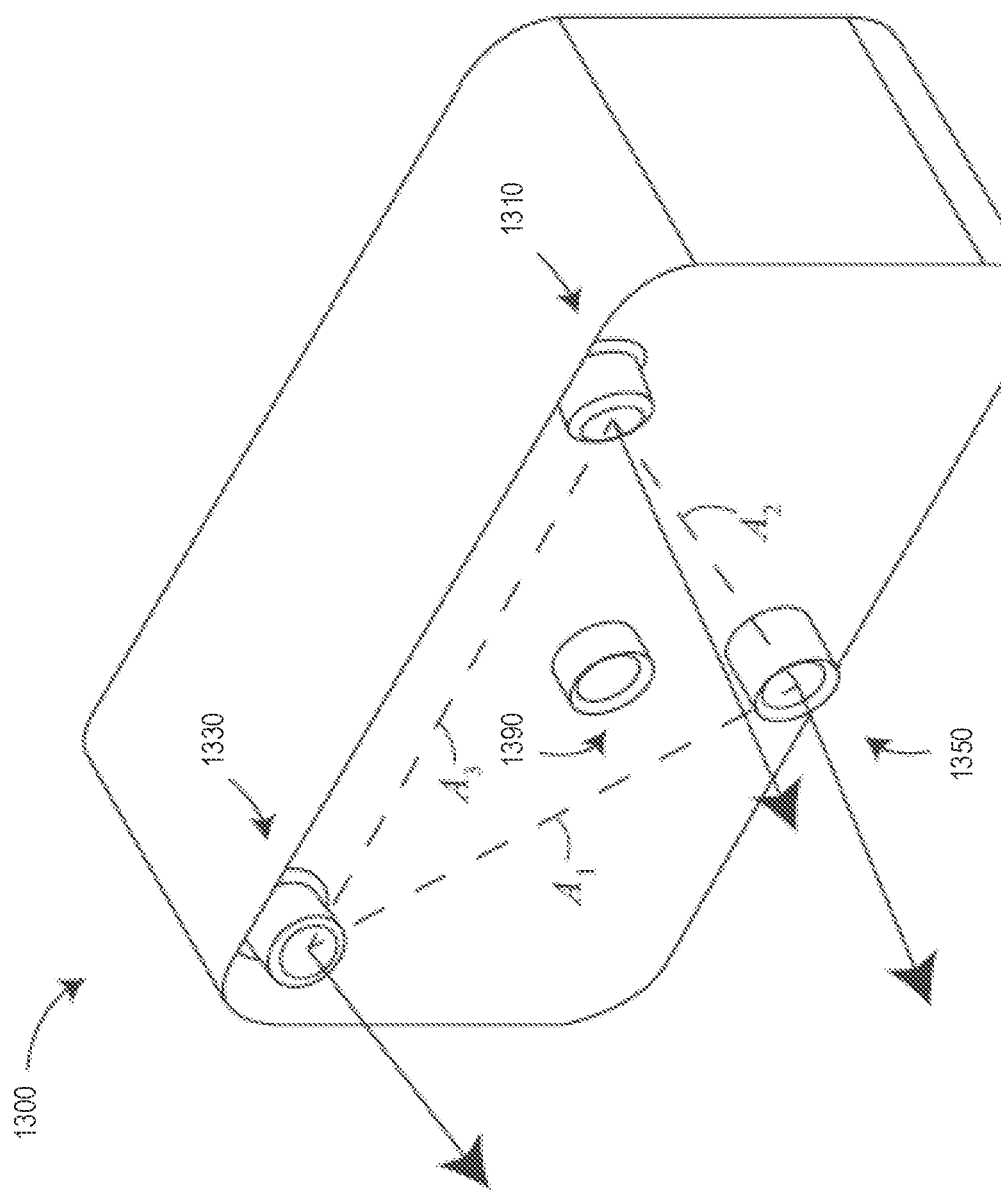
FIG. 13 is an isometric view of a triangulation scanner having a projector and two cameras arranged in a triangle according to one or more embodiments described herein.

An alternative method that uses the intersection of epipolar lines on epipolar planes to establish correspondence among uncoded points projected in an uncoded pattern is described in U.S. Pat. No. 9,599,455 ('455) to Heidemann, et al., the contents of which are incorporated by reference herein. In an embodiment of the method described in Patent '455, a triangulation scanner places a projector and two cameras in a triangular pattern. An example of a triangulation scanner 1300 having such a triangular pattern is shown in FIG. 13. The triangulation scanner 1300 includes a projector 1350, a first camera 1310, and a second camera 1330 arranged in a triangle having sides A1-A2-A3. In an embodiment, the triangulation scanner 1300 may further include an additional camera 1390 not used for triangulation but to assist in registration and colorization.

Figure 14:
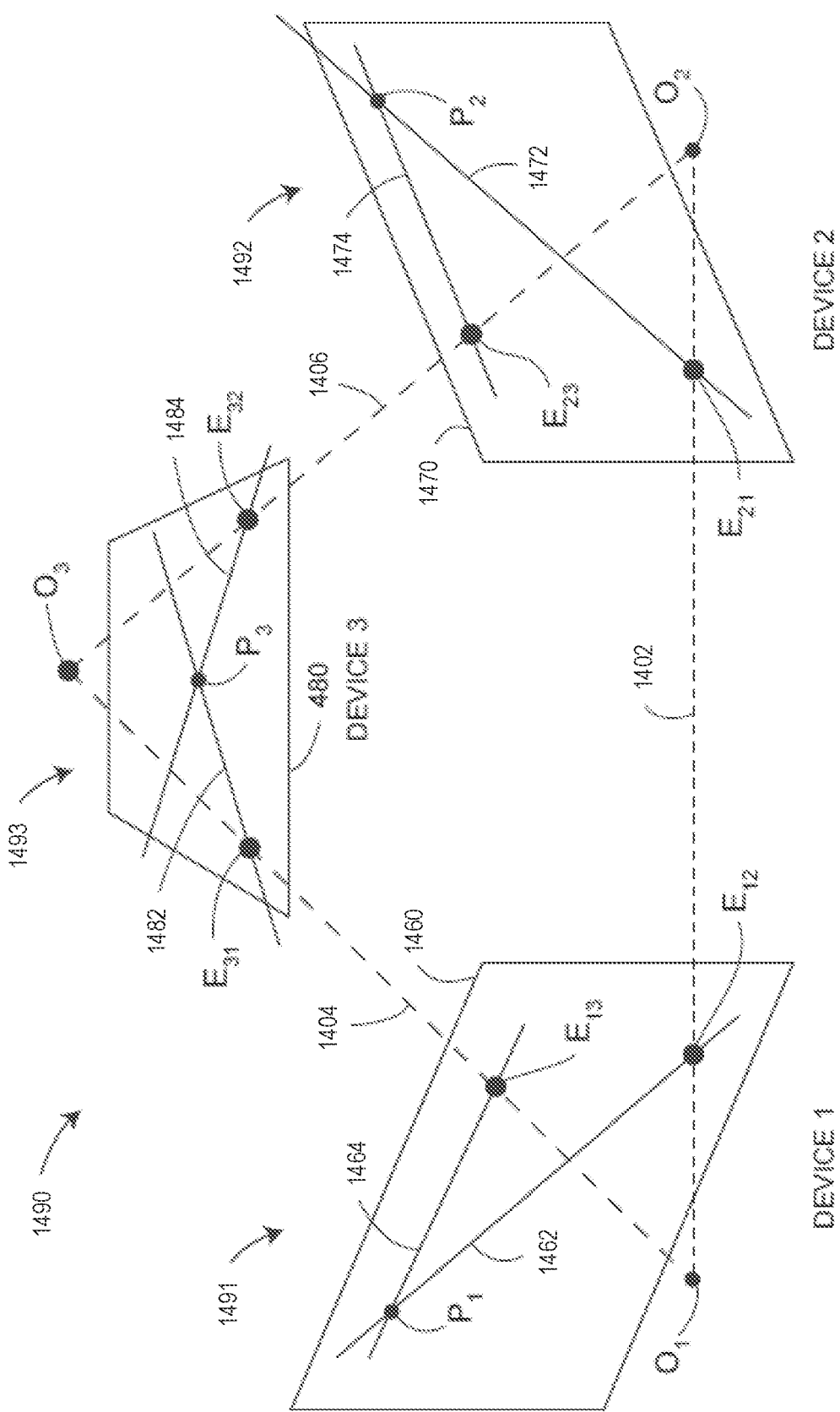
FIG. 14 is a schematic illustration of intersecting epipolar lines in epipolar planes for a combination of projectors and cameras according to one or more embodiments described herein.

Referring now to FIG. 14 the epipolar relationships for a 3D imager (triangulation scanner) 1490 correspond with 3D imager 1300 of FIG. 13 in which two cameras and one projector are arranged in the shape of a triangle having sides 1402, 1404, 1406. In general, the device 1, device 2, and device 3 may be any combination of cameras and projectors as long as at least one of the devices is a camera. Each of the three devices 1491, 1492, 1493 has a perspective center O1, O2, O3, respectively, and a reference plane 1460, 1470, and 1480, respectively. In FIG. 14, the reference planes 1460, 1470, 1480 are epipolar planes corresponding to physical planes such as an image plane of a photosensitive array or a projector plane of a projector pattern generator surface but with the planes projected to mathematically equivalent positions opposite the perspective centers O1, O2, O3. Each pair of devices has a pair of epipoles, which are points at which lines drawn between perspective centers intersect the epipolar planes. Device 1 and device 2 have epipoles E12, E21 on the planes 1460, 1470, respectively. Device 1 and device 3 have epipoles E13, E31, respectively on the planes 1460, 1480, respectively. Device 2 and device 3 have epipoles E23, E32 on the planes 1470, 1480, respectively. In other words, each reference plane includes two epipoles. The reference plane for device 1 includes epipoles E12 and E13. The reference plane for device 2 includes epipoles E21 and E23. The reference plane for device 3 includes epipoles E31 and E32.

In an embodiment, the device 3 is a projector 1493, the device 1 is a first camera 1491, and the device 2 is a second camera 1492. Suppose that a projection point P3, a first image point P1, and a second image point P2 are obtained in a measurement. These results can be checked for consistency in the following way.

To check the consistency of the image point P1, intersect the plane P3-E31-E13 with the reference plane 1460 to obtain the epipolar line 1464. Intersect the plane P2-E21-E12 to obtain the epipolar line 1462. If the image point P1 has been determined consistently, the observed image point P1 will lie on the intersection of the determined epipolar lines 1462 and 1464.

To check the consistency of the image point P2, intersect the plane P3-E32-E23 with the reference plane 1470 to obtain the epipolar line 1474. Intersect the plane P1-E12-E21 to obtain the epipolar line 1472. If the image point P2 has been determined consistently, the observed image point P2 will lie on the intersection of the determined epipolar lines 1472 and 1474.

To check the consistency of the projection point P3, intersect the plane P2-E23-E32 with the reference plane 1480 to obtain the epipolar line 1484. Intersect the plane P1-E13-E31 to obtain the epipolar line 1482. If the projection point P3 has been determined consistently, the projection point P3 will lie on the intersection of the determined epipolar lines 1482 and 1484.

It should be appreciated that since the geometric configuration of device 1, device 2 and device 3 are known, when the projector 1493 emits a point of light onto a point on an object that is imaged by cameras 1491, 1492, the 3D coordinates of the point in the frame of reference of the 3D imager 1490 may be determined using triangulation methods.

Note that the approach described herein above with respect to FIG. 14 may not be used to determine 3D coordinates of a point lying on a plane that includes the optical axes of device 1, device 2, and device 3 since the epipolar lines are degenerate (fall on top of one another) in this case. In other words, in this case, intersection of epipolar lines is no longer obtained. Instead, in an embodiment, determining self-consistency of the positions of an uncoded spot on the projection plane of the projector and the image planes of the first and second cameras is used to determine correspondence among uncoded spots, as described herein above in reference to FIGS. 12B, 12C, 12D, 12E.

FIGS. 15A, 15B, 15C, 15D, 15E are schematic illustrations of alternative embodiments of the projector 1120. In FIG. 15A, a projector 1500 includes a light source, mirror 1504, and diffractive optical element (DOE) 1506. The light source 1502 may be a laser, a superluminescent diode, or a partially coherent LED, for example. The light source 1502 emits a beam of light 1510 that reflects off mirror 1504 and passes through the DOE. In an embodiment, the DOE 11506 produces an array of diverging and uniformly distributed light spots 512. In FIG. 15B, a projector 1520 includes the light source 1502, mirror 1504, and DOE 1506 as in FIG. 15A. However, in the projector 1520 of FIG. 15B, the mirror 1504 is attached to an actuator 1522 that causes rotation 1524 or some other motion (such as translation) in the mirror. In response to the rotation 1524, the reflected beam off the mirror 1504 is redirected or steered to a new position before reaching the DOE 1506 and producing the collection of light spots 1512. In system 1530 of FIG. 15C, the actuator is applied to a mirror 1532 that redirects the beam 1512 into a beam 1536. Other types of steering mechanisms such as those that employ mechanical, optical, or electro-optical mechanisms may alternatively be employed in the systems of FIGS. 15A, 15B, 15C. In other embodiments, the light passes first through the pattern generating element 1506 and then through the mirror 1504 or is directed towards the object space without a mirror 1504.

In the system 1540 of FIG. 5D, an electrical signal is provided by the electronics 1544 to drive a projector pattern generator 1542, which may be a pixel display such as a Liquid Crystal on Silicon (LCoS) display to serve as a pattern generator unit, for example. The light 1545 from the LCoS display 1542 is directed through the perspective center 1547 from which it emerges as a diverging collection of uncoded spots 1548. In system 1550 of FIG. 15E, a source is light 1552 may emit light that may be sent through or reflected off of a pattern generating unit 1554. In an embodiment, the source of light 1552 sends light to a digital micromirror device (DMD), which reflects the light 1555 through a lens 1556. In an embodiment, the light is directed through a perspective center 1557 from which it emerges as a diverging collection of uncoded spots 1558 in an uncoded pattern. In another embodiment, the source of light 1562 passes through a slide 1554 having an uncoded pattern of dots before passing through a lens 1556 and proceeding as an uncoded pattern of light 1558. In another embodiment, the light from the light source 1552 passes through a lenslet array 1554 before being redirected into the pattern 1558. In this case, inclusion of the lens 1556 is optional.

The actuators 1522, 1534, also referred to as beam steering mechanisms, may be any of several types such as a piezo actuator, a microelectromechanical system (MEMS) device, a magnetic coil, or a solid-state deflector.

Figure 16A:
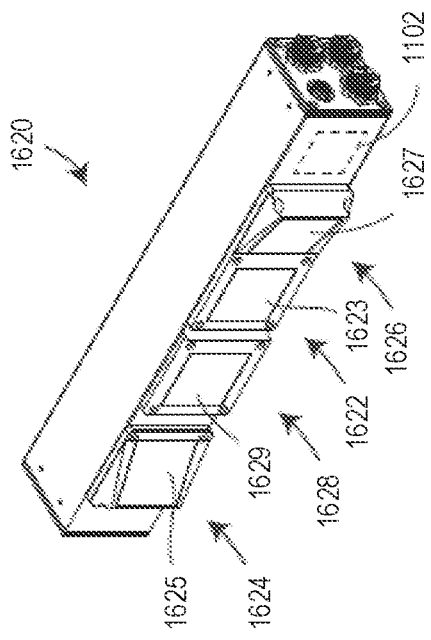
FIG. 16A is an isometric view of a triangulation scanner having two projectors and one camera according to one or more embodiments described herein.

FIG. 16A is an isometric view of a triangulation scanner 1600 that includes a single camera 1602 and two projectors 1604, 1606, these having windows 1603, 1605, 1607, respectively. In the triangulation scanner 1600, the projected uncoded spots by the projectors 1604, 1606 are distinguished by the camera 1602. This may be the result of a difference in a characteristic in the uncoded projected spots. For example, the spots projected by the projector 1604 may be a different color than the spots projected by the projector 1606 if the camera 1602 is a color camera. In another embodiment, the triangulation scanner 1600 and the object under test are stationary during a measurement, which enables images projected by the projectors 1604, 1606 to be collected sequentially by the camera 1602. The methods of determining correspondence among uncoded spots and afterwards in determining 3D coordinates are the same as those described earlier in FIG. 12 for the case of two cameras and one projector. In an embodiment, the system 1600 includes a processor 1102 that carries out computational tasks such as determining correspondence among uncoded spots in projected and image planes and in determining 3D coordinates of the projected spots.

Figure 16B:
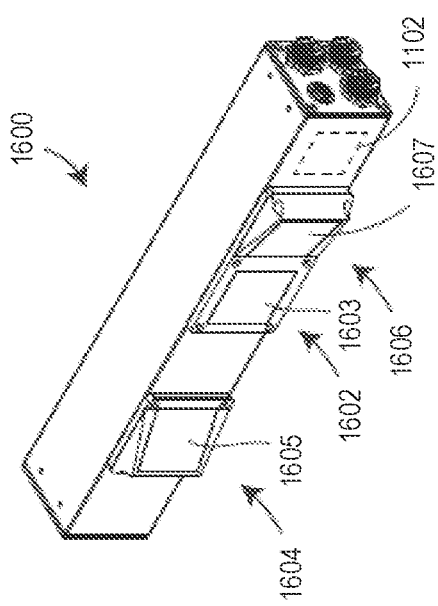
FIG. 16B is an isometric view of a triangulation scanner having three cameras and one projector according to one or more embodiments described herein.

FIG. 16B is an isometric view of a triangulation scanner 1620 that includes a projector 1622 and in addition includes three cameras: a first camera 1624, a second camera 1626, and a third camera 1628. These aforementioned projector and cameras are covered by windows 1623, 1625, 1627, 1629, respectively. In the case of a triangulation scanner having three cameras and one projector, it is possible to determine the 3D coordinates of projected spots of uncoded light without knowing in advance the pattern of dots emitted from the projector. In this case, lines can be drawn from an uncoded spot on an object through the perspective center of each of the three cameras. The drawn lines may each intersect with an uncoded spot on each of the three cameras. Triangulation calculations can then be performed to determine the 3D coordinates of points on the object surface. In an embodiment, the triangulation scanner 1620 includes the processor 1102 that carries out operational methods such as verifying correspondence among uncoded spots in three image planes and in determining 3D coordinates of projected spots on the object.

Figure 16C:
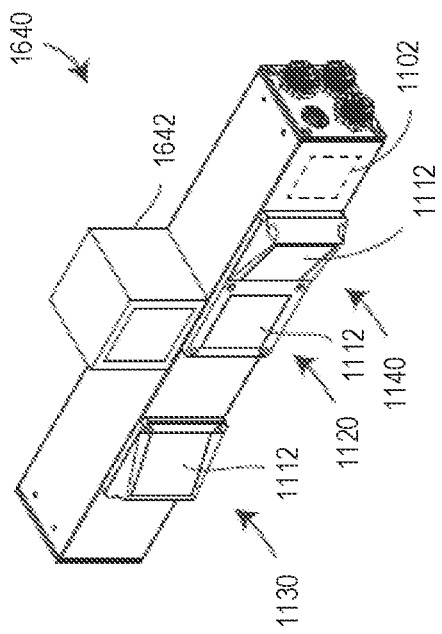
FIG. 16C is an isometric view of a triangulation scanner having one projector and two cameras and further including a camera to assist in registration or colorization according to one or more embodiments described herein.

FIG. 16C is an isometric view of a triangulation scanner 1640 like that of FIG. 1A except that it further includes a camera 1642, which is coupled to the triangulation scanner 1640. In an embodiment the camera 1642 is a color camera that provides colorization to the captured 3D image. In a further embodiment, the camera 1642 assists in registration when the camera 1642 is moved—for example, when moved by an operator or by a robot.

Figure 17B:
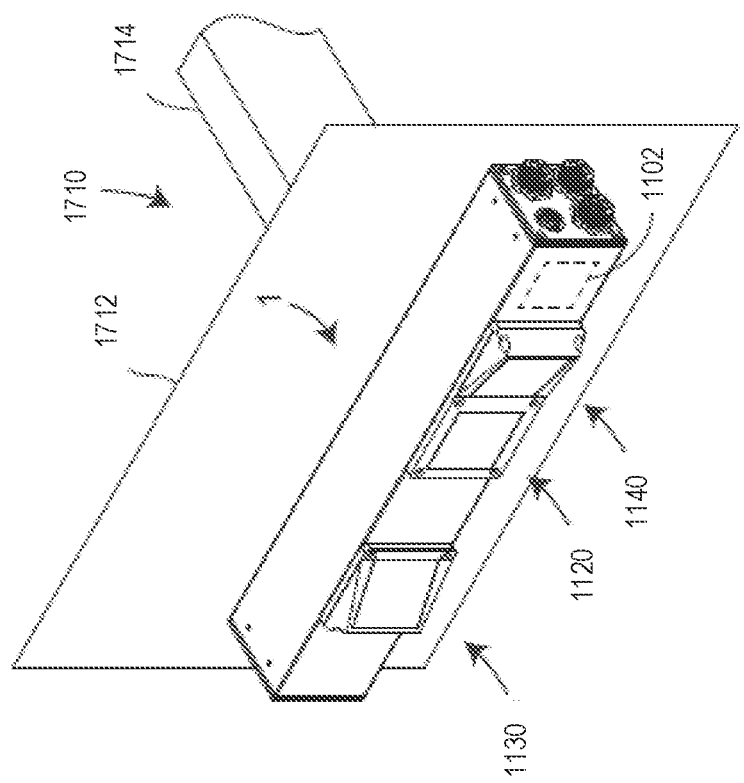
FIG. 17B illustrates a triangulation scanner moved by a robot end effector, according to one or more embodiments described herein.
Figure 17A:
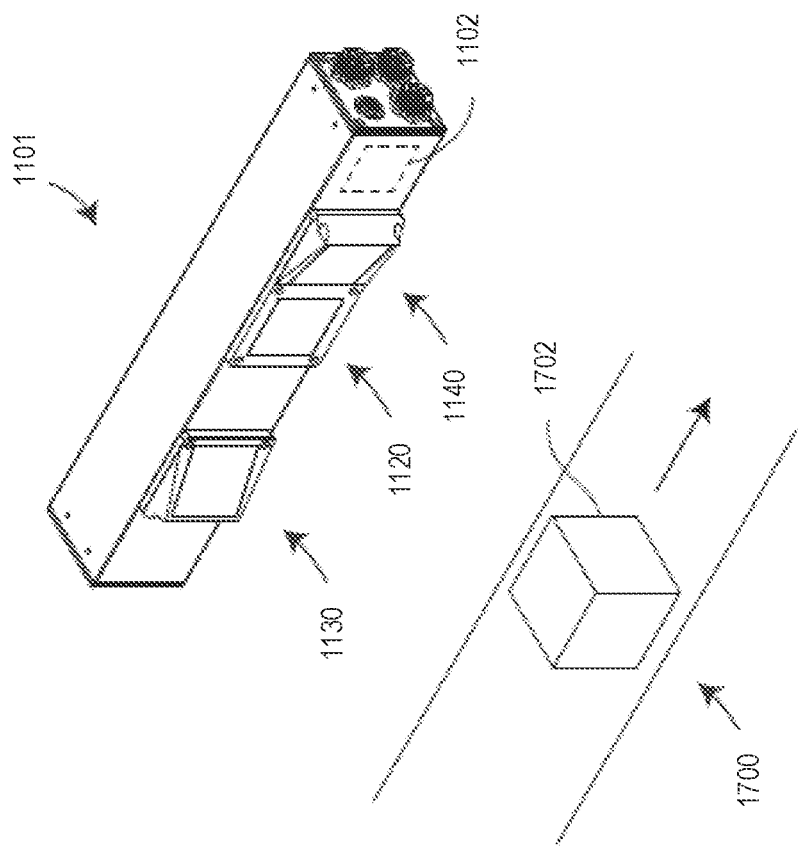
FIG. 17A illustrates a triangulation scanner used to measure an object moving on a conveyor belt according to one or more embodiments described herein.

FIGS. 17A, 17B illustrate two different embodiments for using the triangulation scanner 1 in an automated environment. FIG. 17A illustrates an embodiment in which a scanner 1 is fixed in position and an object under test 1702 is moved, such as on a conveyor belt 1700 or other transport device. The scanner 1 obtains 3D coordinates for the object 1702. In an embodiment, a processor, either internal or external to the scanner 1, further determines whether the object 1702 meets its dimensional specifications. In some embodiments, the scanner 1 is fixed in place, such as in a factory or factory cell for example, and used to monitor activities. In one embodiment, the processor 1102 monitors whether there is risk of contact with humans from moving equipment in a factory environment and, in response, issue warnings, alarms, or cause equipment to stop moving.

FIG. 17B illustrates an embodiment in which a triangulation scanner 1 is attached to a robot end effector 1710, which may include a mounting plate 1712 and robot arm 1714. The robot may be moved to measure dimensional characteristics of one or more objects under test. In further embodiments, the robot end effector is replaced by another type of moving structure. For example, the triangulation scanner 1101 may be mounted on a moving portion of a machine tool.

Figure 18:
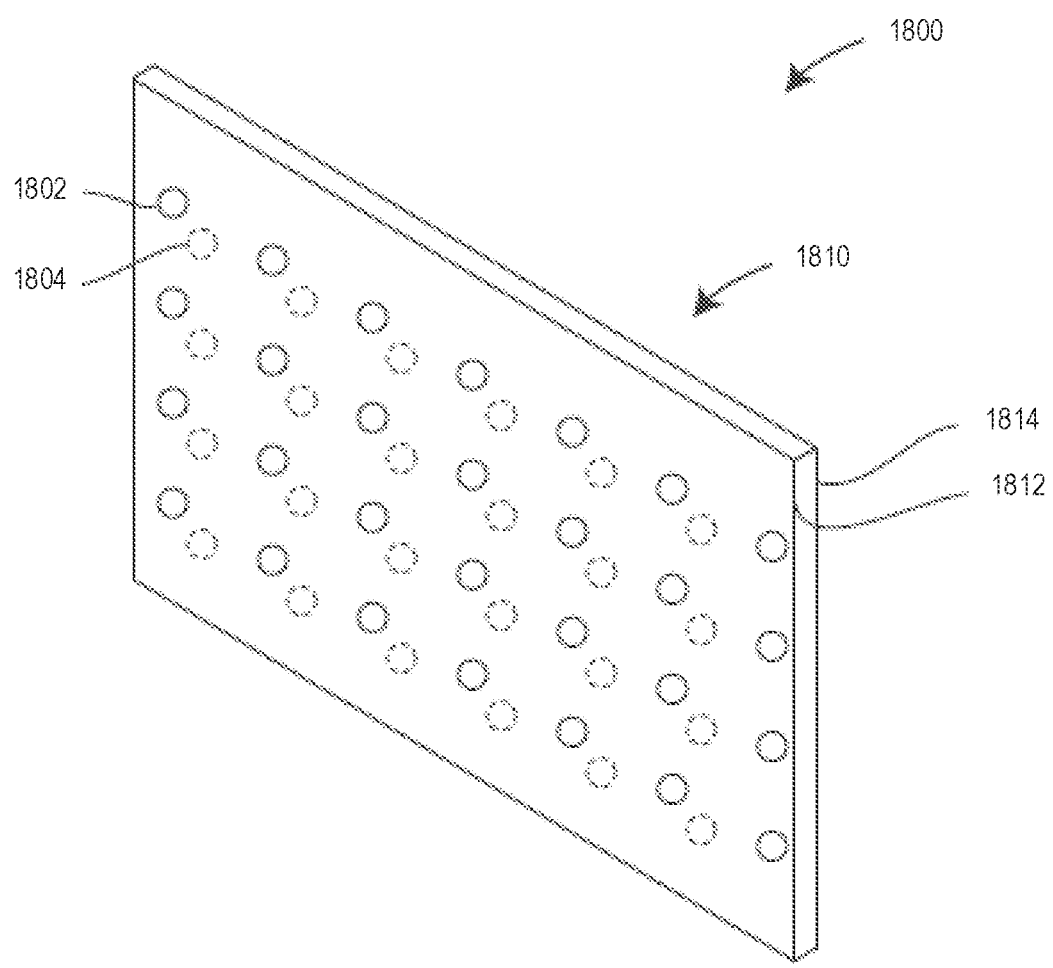
FIG. 18 illustrates front and back reflections off a relatively transparent material such as glass according to one or more embodiments described herein.

FIG. 18 is a schematic isometric drawing of a measurement application 1800 that may be suited to the triangulation scanners described herein above. In an embodiment, a triangulation scanner 1101 sends uncoded spots of light onto a sheet of translucent or nearly transparent material 1810 such as glass. The uncoded spots of light 1802 on the glass front surface 1812 arrive at an angle to a normal vector of the glass front surface 1812. Part of the optical power in the uncoded spots of light 1802 pass through the front surface 1812, are reflected off the back surface 1814 of the glass, and arrive a second time at the front surface 1812 to produce reflected spots of light 1804, represented in FIG. 18 as dashed circles. Because the uncoded spots of light 1802 arrive at an angle with respect to a normal of the front surface 1812, the spots of light 1804 are shifted laterally with respect to the spots of light 1802. If the reflectance of the glass surfaces is relatively high, multiple reflections between the front and back glass surfaces may be picked up by the triangulation scanner 1.

The uncoded spots of lights 1802 at the front surface 1812 satisfy the criterion described with respect to FIG. 12 in being intersected by lines drawn through perspective centers of the projector and two cameras of the scanner. For example, consider the case in which in FIG. 12 the element 1250 is a projector, the elements 1210, 1230 are cameras, and the object surface 1270 represents the glass front surface 1270. In FIG. 12, the projector 1250 sends light from a point 1253 through the perspective center 1258 onto the object 1270 at the position 1272. Let the point 1253 represent the center of a spot of light 1802 in FIG. 18. The object point 1272 passes through the perspective center 1218 of the first camera onto the first image point 1220. It also passes through the perspective center 1238 of the second camera 1230 onto the second image point 1235. The image points 1200, 1235 represent points at the center of the uncoded spots 1802. By this method, the correspondence in the projector and two cameras is confirmed for an uncoded spot 1802 on the glass front surface 1812. However, for the spots of light 1804 on the front surface that first reflect off the back surface, there is no projector spot that corresponds to the imaged spots. In other words, in the representation of FIG. 12, there is no condition in which the lines 1211, 1231, 1251 intersect in a single point 1272 for the reflected spot 1204. Hence, using this method, the spots at the front surface may be distinguished from the spots at the back surface, which is to say that the 3D coordinates of the front surface are determined without contamination by reflections from the back surface. This is possible as long as the thickness of the glass is large enough and the glass is tilted enough relative to normal incidence. Separation of points reflected off front and back glass surfaces is further enhanced by a relatively wide spacing of uncoded spots in the projected uncoded pattern as illustrated in FIG. 18. Although the method of FIG. 18 was described with respect to the scanner 1, the method would work equally well for other scanner embodiments such as the scanners 1600, 1620, 1640 of FIGS. 16A, 16B, 16C, respectively.

Terms such as processor, controller, computer, DSP, FPGA are understood in this document to mean a computing device that may be located within an instrument, distributed in multiple elements throughout an instrument, or placed external to an instrument.

While embodiments of the invention have been described in detail in connection with only a limited number of embodiments, it should be readily understood that the invention is not limited to such disclosed embodiments. Rather, the embodiments of the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the embodiments of the invention are not to be seen as limited by the foregoing description but is only limited by the scope of the appended claims.

What is claimed is:

1. A method comprising:
acquiring a measured point cloud of an object using a three-dimensional scanner to scan the object;
performing a point cloud alignment between the measured point cloud and a reference point cloud;
performing a multi-scale model-to-model cloud comparison between the measurement point cloud and the reference point cloud to determine a displacement value between each point in the measurement point cloud and a corresponding point in the reference point cloud;

performing displaced points filtering on the multi-scale model-to-model cloud comparison to identify displaced points by comparing the displacement value for each point in the measurement point cloud to a threshold value;

performing multi-radii cluster matching with at least one cluster size for each of a plurality of displaced points of the measurement point cloud;

performing extraction of the displaced points;

performing segmentation to generate larger clusters of connected regions using region growing segmentation on the displaced points;

performing segment matching between the displaced points and the reference point cloud;

performing segment filtering to remove displaced segments from the measurement point cloud; and determining whether the object measured in the measurement point cloud is at least one of displaced and defective.

2. The method of claim 1, wherein the reference point cloud is a computer-aided design model.

3. The method of claim 1, wherein the reference point cloud is scan data of a scanned golden part.

4. The method of claim 1, wherein a set of points selected for a cluster is based at least in part on a result of a point-wise distance analysis between the measurement point cloud and the reference point cloud.

5. The method of claim 1, wherein performing the multi-radii cluster matching comprises determining a first cluster defined by a first radius R1.

6. The method of claim 5, wherein performing the multi-radii cluster matching comprises determining a second cluster defined by a second radius R2, wherein the second radius R2 is greater than the first radius R1.

7. The method of claim 6, wherein determining, based on results of the multi-radii cluster matching, whether the object is displaced is based on one or more of a mean value, a median value, a standard deviation, or a median of an absolute distance.

8. The method of claim 1, wherein performing the multi-radii cluster matching comprises applying an iterative closest point technique to match points in a test cluster with points in a reference cluster.

9. The method of claim 1, wherein performing the multi-radii cluster matching comprises generating a transformation matrix.

10. The method of claim 8, wherein the transformation matrix is used to calculate a new displacement value.

11. The method of claim 9 wherein a distance of a center of mass of the cluster of the reference point cloud and a center of mass of the cluster of the measured point cloud is used to calculate the new displacement vector.

12. The method claim 1, wherein performing the multi-radii cluster matching comprises determining a first cluster defined by a first radius R1, determining a second cluster defined by a second radius R2, determining a third cluster defined by a third radius R3, and determining a fourth cluster defined by a fourth radius R4, wherein the fourth radius R4 is greater than the third radius R3, which is greater than the second radius R2, which is greater than the first radius R1.

13. A method comprising:

acquiring a measured point cloud of an object using a three-dimensional scanner to scan the object;

performing a point cloud alignment between the measured point cloud and a reference point cloud;

performing a multi-scale model-to-model cloud comparison between the measurement point cloud and the reference point cloud;

performing displaced points filtering;

performing multi-radii cluster matching;

performing extraction of displaced points;

performing segmentation;

performing segment matching;

performing segments filtering; and determining whether the object is displaced.

* * * * *